US011081786B2

(12) United States Patent
Bell et al.

(10) Patent No.: US 11,081,786 B2
(45) Date of Patent: Aug. 3, 2021

(54) LOW-PIM UNIVERSAL CABLE HANGER SYSTEM

(71) Applicant: ConcealFab Corporation, Colorado Springs, CO (US)

(72) Inventors: Thomas Bell, Colorado Springs, CO (US); Steve Rogers, Colorado Springs, CO (US); Jacob Lovelady, Colorado Springs, CO (US)

(73) Assignee: ConcealFab Corporation, Colorado Springs, CO (US)

( * ) Notice: Subject to any disclaimer, the term of this patent is extended or adjusted under 35 U.S.C. 154(b) by 0 days.

(21) Appl. No.: 17/086,605

(22) Filed: Nov. 2, 2020

(65) Prior Publication Data

US 2021/0135352 A1 May 6, 2021

Related U.S. Application Data

(60) Provisional application No. 62/930,734, filed on Nov. 5, 2019.

(51) Int. Cl.
*H01Q 1/52* (2006.01)
*H05K 7/18* (2006.01)
*H01Q 1/24* (2006.01)

(52) U.S. Cl.
CPC ............... *H01Q 1/52* (2013.01); *H01Q 1/246* (2013.01); *H05K 7/186* (2013.01)

(58) Field of Classification Search
CPC .......... H01Q 1/52; H01Q 1/246; H05K 7/186; A47B 2097/003; H04M 1/15; H01B 7/0045
See application file for complete search history.

(56) References Cited

U.S. PATENT DOCUMENTS 2,663,531 A * 12/1953 Rubano .................. A47B 97/04
248/229.17
2,689,995 A * 9/1954 Smith ....................... B01L 9/50
285/61

(Continued)

OTHER PUBLICATIONS

SitePro1 a Valmont Company (website), https://www.sitepro 1 .com/store/cart. ph p?m=product_list&c= 1, Oct. 21, 2006.

(Continued)

*Primary Examiner* — Lewis G West
(74) *Attorney, Agent, or Firm* — Mehrman Law Office; Michael J. Mehrman

(57) ABSTRACT

A low passive intermodulation (PIM) cable hangers system includes several types of universal bases that each include a standard end effector receptacle integrally formed with a mounting adapter designed to interface with a support structure having a particular shape. For example, a first type of universal base includes a pole adapter, and a second type of universal base includes an angle adapter. The standard end effector receptacle is designed to receive a standard fitting integrally formed into a range of end effectors, such as a low-PIM barrel cable block, a low-PIM junction box for receiving snap-in cable hangers, and a low-PIM dual-rod cable hanger allowing different types of universal bases to be mixed and matched interchangeably with different types of end effectors. Cable ties are used to secure the universal bases and end effectors to support structures, such as pole supports and angle supports.

22 Claims, 19 Drawing Sheets

(56) References Cited

U.S. PATENT DOCUMENTS

| | | | |
|---|---|---|---|
| 3,012,750 A * | 12/1961 | Schermerhorn, Jr. | ............. A47B 57/56 248/230.9 |
| 3,023,989 A * | 3/1962 | White | ............. F16L 3/2235 248/68.1 |
| 3,298,717 A * | 1/1967 | Rothwell | ............. F16L 41/12 285/197 |
| 3,933,377 A * | 1/1976 | Arrowood | ............. F16L 3/00 285/61 |
| 4,595,185 A | 6/1986 | Kitagawa | |
| 4,784,552 A | 11/1988 | Rebentisch et al. | |
| 5,658,066 A * | 8/1997 | Hirsch | ............. F21V 21/005 362/219 |
| 5,794,897 A | 8/1998 | Jobin et al. | |
| 6,354,543 B1 | 3/2002 | Paske | |
| 6,443,402 B1 | 9/2002 | Ferrill et al. | |
| 6,502,796 B1 | 1/2003 | Wales | |
| 6,622,976 B1 | 9/2003 | Ianello | |
| 6,899,305 B2 | 3/2005 | Korczak et al. | |
| 7,090,174 B2 | 8/2006 | Korzak | |
| 7,293,745 B2 | 11/2007 | Catapano | |
| 8,011,621 B2 | 9/2011 | Korczak | |
| 8,191,836 B2 | 6/2012 | Korzak | |
| 8,439,316 B2 | 5/2013 | Feige | |
| 9,022,357 B2 * | 5/2015 | Argyle | ............. H02G 1/06 254/134.3 PA |
| 9,086,175 B2 * | 7/2015 | Feige | ............. F16L 3/13 |
| 9,219,461 B2 * | 12/2015 | Zimmerman | ............. H01P 5/028 |
| 9,267,624 B2 * | 2/2016 | Railsback | ............. F16L 3/227 |
| 9,853,434 B2 * | 12/2017 | Vaccaro | ............. F16B 1/00 |
| 9,866,004 B2 * | 1/2018 | Vaccaro | ............. E01F 9/608 |
| 9,869,331 B2 * | 1/2018 | Muntasser | ............. F16B 2/08 |
| 9,903,510 B2 * | 2/2018 | Joshi | ............. F16L 3/13 |
| 9,995,414 B2 | 6/2018 | Joshi et al. | |
| 10,158,218 B2 | 12/2018 | Vaccaro et al. | |
| 10,243,339 B2 | 3/2019 | Vaccaro et al. | |
| 10,253,906 B2 | 4/2019 | Vaccaro | |
| 10,422,446 B2 * | 9/2019 | Joshi | ............. F16L 3/221 |
| 10,724,655 B2 * | 7/2020 | Bell | ............. F16L 3/1222 |
| 2002/0005463 A1 | 1/2002 | Paske et al. | |
| 2002/0066833 A1 * | 6/2002 | Ferrill | ............. H02G 3/32 248/62 |
| 2005/0023421 A1 | 2/2005 | Wood et al. | |
| 2005/0029419 A1 * | 2/2005 | Ware | ............. G09F 7/18 248/218.4 |
| 2009/0294602 A1 * | 12/2009 | Korczak | ............. H02G 3/30 248/74.2 |
| 2010/0000763 A1 * | 1/2010 | Stansberry, Jr. | ............. H02G 7/05 174/146 |
| 2011/0186693 A1 | 8/2011 | McMiles et al. | |
| 2011/0226913 A1 | 9/2011 | Feige | |
| 2012/0292460 A1 * | 11/2012 | Hsu | ............. H02G 7/053 248/70 |
| 2013/0098674 A1 * | 4/2013 | Shoemaker | ............. H01B 7/40 174/480 |
| 2014/0086704 A1 | 3/2014 | Hemingway et al. | |
| 2015/0349399 A1 * | 12/2015 | Lasier | ............. H05B 47/19 343/721 |
| 2017/0122460 A1 * | 5/2017 | Joshi | ............. F16L 3/222 |
| 2018/0045336 A1 * | 2/2018 | Vaccaro | ............. F16L 3/221 |
| 2018/0138678 A1 | 5/2018 | Vacarro et al. | |
| 2018/0152253 A1 * | 5/2018 | Bell | ............. B32B 7/12 |
| 2018/0175596 A1 * | 6/2018 | Sugino | ............. H01B 7/0045 |
| 2019/0003616 A1 | 1/2019 | Wargo | |
| 2019/0383426 A1 * | 12/2019 | Vaccaro | ............. F16B 21/088 |

OTHER PUBLICATIONS

Petrilla Technologies, LLC (website), https://petrillatechnologies.com/support-accessories.html, Mar. 24, 2017.

CommScope (website), https://www.commscope.com/catalog/tools_accessories/product.aspx?id=46, Oct. 28, 2012.

FIMO, "Product Data Sheet, BAP 10, Plastic Socle for BFI 10 Threaded Bars" Apr. 13, 2016 (and associated photograph).

* cited by examiner

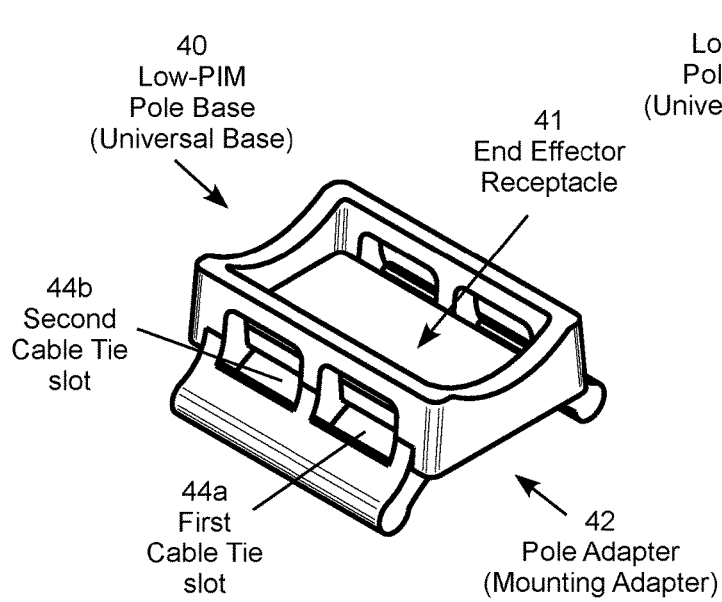
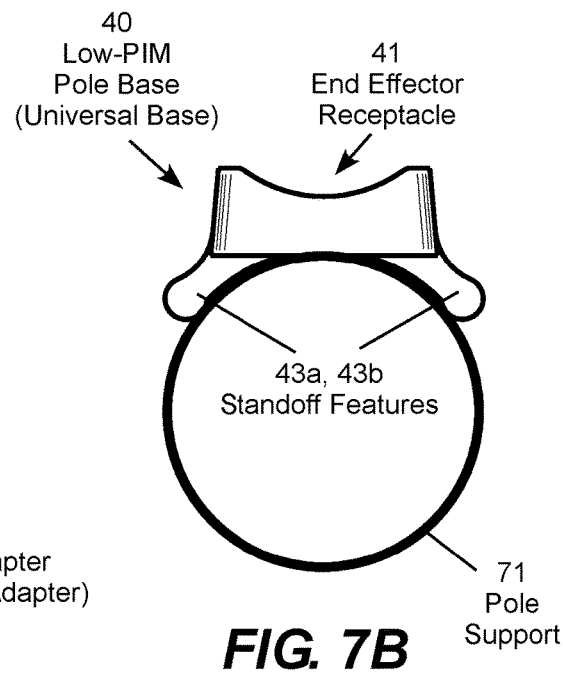
FIG. 7A
FIG. 7B
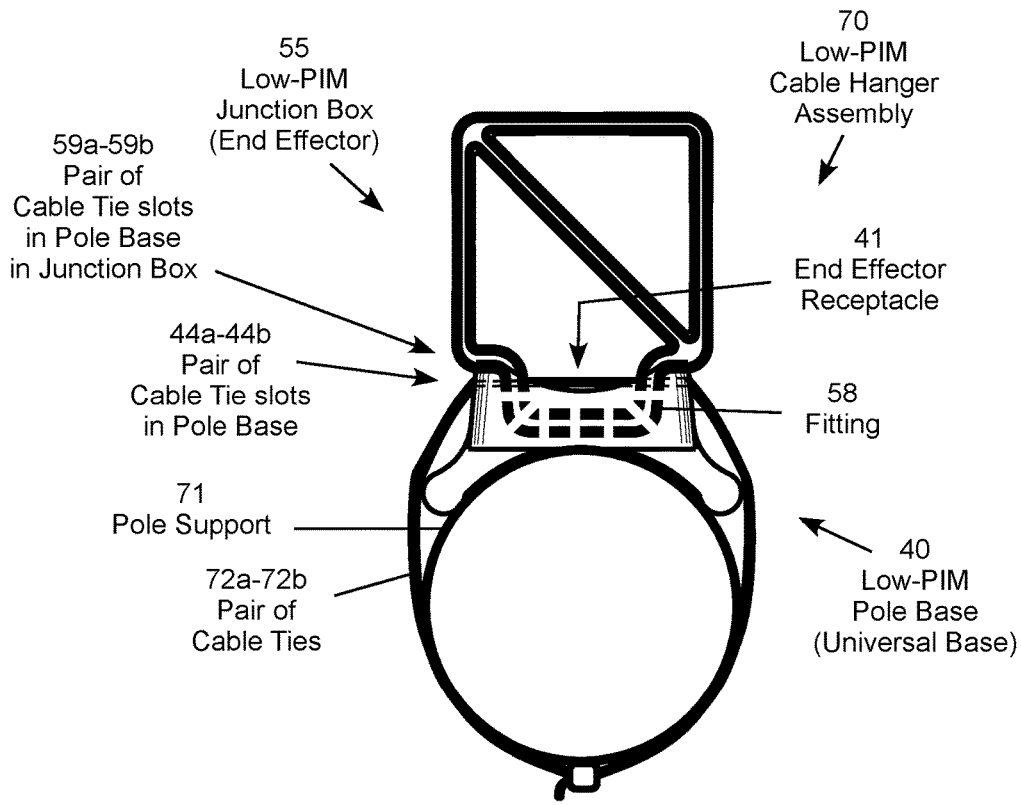
FIG. 7C

LOW-PIM UNIVERSAL CABLE HANGER SYSTEM

REFERENCE TO RELATED APPLICATIONS

This application claims priority to U.S. Provisional Patent Application Ser. No. 62/930,734 filed Nov. 5, 2019, which is incorporated by reference.

TECHNICAL FIELD

The present invention is directed to cellular communication systems and, more particularly, to polymeric cable hanger assemblies used to reduce passive intermodulation interference (PIM) at cellular telephone base station antenna sites.

BACKGROUND

An essential element of modern mobile communications systems is the "cell site." The cell site includes one or more cellular base station antennas aimed at a desired geographical area of coverage with coaxial cables connecting the antennas to base station radio equipment. The performance of a cell site is often limited by passive intermodulation ("PIM") interference. PIM interference occurs when the high-power downlink signals (the "main beam") transmitted by the base station antenna mixes at passive, non-linear junctions in the RF path, creating new signals. When these new signals (intermodulation products) fall in an antenna's uplink band, they act as interference and reduce the signal-to-interference-plus-noise ratio ("SINR"). As the SINR reduces, the geographic coverage of the cell site reduces and the data capacity of that cell site reduces.

It is well documented that loosely touching metal-to-metal surfaces can behave in a non-linear fashion and become sources of passive intermodulation when illuminated by high power RF signals. Recently, it has been determined that loose metal-to-metal connections located behind base station antennas are also able to generate high levels of passive intermodulation. Even though this region is well outside the main beam of the antenna, enough RF energy is present in this region to excite non-linear objects and generate PIM.

Metal brackets and associated hardware for supporting RF, optical, ground and remote electrical tilt ("RET") cable are common sources of loose metal-to-metal contact found in the region behind and close to base station antennas. These cables are secured by cable hangers spaced along their length to the antenna support frame to prevent the cables from moving in the wind. Antenna support frames are often constructed using structural steel angle and pipe supports with metal cable hangers used to secure the cables to the frame. For example, FIG. 1 is a side view and FIG. 2 is a perspective view of a conventional cable hanger assembly 10, which includes a metal cable hanger 11 that supports a cable 12 that is routed through the cable hanger. The cable hanger 11 is connected to a "U" shaped metal angle adapter 13, which is connected to a metal support structure 14, such as an angle support or flange forming part of the antenna support frame. The "U" shaped angle adapter 13 includes a receptacle hole, typically 0.75-inch in (19 mm) diameter, that accepts the snap-in type cable hanger 11. The angle adapter 13 is typically fabricated from stainless-steel with serrated teeth 15 on one side and a threaded hole on the opposite side. A set screw 16 is installed into the threaded hole and, when tightened, drives the end of the set screw into one side of the support structure 14. This in turn drives the serrated teeth into the opposite side of the support structure 14.

Multiple sources of passive intermodulation are present with this conventional cable hanger assembly 10. First, the set screw 16 used to secure the angle adapter 13 to the support structure 14 may not be tightened sufficiently or loosen over time, which can cause PIM to be generated at the loose metal-to-metal contact between the angle adapter and a support structure. Second, even if tightened sufficiently, there is potential for PIM generation at the corner of the "U" shaped angle adapter 13 where it touches the support structure 14. Third, the angle adapter 13 and the set screw are usually constructed from stainless-steel while the support structure 14 is usually constructed from galvanized steel. Galvanized steel and stainless steel are dissimilar metals at opposite ends of the galvanic series. This causes small pockets of corrosion to form over time where the serrated teeth 15 of the angle adapter 13 and the end of the set screw 16 dig into the galvanized steel support structure 14, which creates another potential source of PIM generation.

A reliable, inexpensive, and easy to deploy cable support solution is therefore needed to secure coaxial cables to galvanized steel support structures in close proximity to base station antennas to mitigate PIM generation.

SUMMARY

The needs described above are met by low-PIM cable hanger assemblies, a universal system of low-PIM cable hanger assemblies, and a method for using the system of low-PIM cable hanger assemblies to secure coaxial cables at cellular base station sites, typically within in the potential PIM reactive zone behind the cellular base station antennas. The system includes a low-PIM universal base including an end effector receptacle and a mounting adapter shaped to mount to a support structure. An end effector includes a fitting shaped to fit within the end effector receptacle of the universal base. At least one cable tie attaches the universal base and the end effector to the support structure. For example, the universal base may include a pair of cable tie slots that receive a pair of cable ties that each extend through a respective cable slot and around a portion of the support structure to attach the universal base and the end effector to the support structure.

Each universal base includes a standard end effector receptacle that includes a mounting adapter designed to interface with a support structure having a particular shape. A number of different types of end effectors, including cable hangers and cable hanger interfaces, have standard fittings that fit into the standard end effector receptacle allowing the different types of universal bases to be mixed and matched interchangeably with the different types of cable hangers and cable hanger interfaces to create a variety of different low-PIM cable hanger assemblies. The system includes multiple types of universal bases, such as a pole base with a pole adapter and an angle base with an angle adapter. The system also includes multiple types of interchangeable universal bases, such as a stackable cable hanger, a barrel cable block, a junction box, and a dual-rod cable hanger. Two universal bases supporting respective end effectors may be attached to the same support structure using a common cable tie or set of cable ties.

The end effector may include a dual-rod cable hanger further comprising a lateral rod socket and a transverse rod socket. In a representative embodiment, a threaded rod extending through the lateral rod socket supports first and second low-PIM rod receiver cable blocks secured to the threaded rod spaced apart from the dual-rod cable hanger on a first side of the dual-rod cable hanger. In another representative embodiment, a threaded rod extending through the transverse rod socket supports one or more low-PIM rod receiver cable blocks secured to the threaded rod spaced apart from the dual-rod cable hanger.

It will be understood that specific embodiments may include a variety of features in different combinations, as desired by different users. The specific techniques and systems for implementing particular embodiments of the invention and accomplishing the associated advantages will become apparent from the following detailed description of the embodiments and the appended drawings and claims.

BRIEF DESCRIPTION OF THE FIGURES

The numerous advantages of the embodiments of the invention may be better understood with reference to the accompanying figures.

FIG. 7A is a perspective view of a low-PIM universal pole base.

FIG. 7B is a side view of the pole base interfacing with a pole support.

FIG. 7C is a side view of the pole base and a junction box attached to the pole base and the pole support with a pair of cable ties.

DETAILED DESCRIPTION

Figure 1:
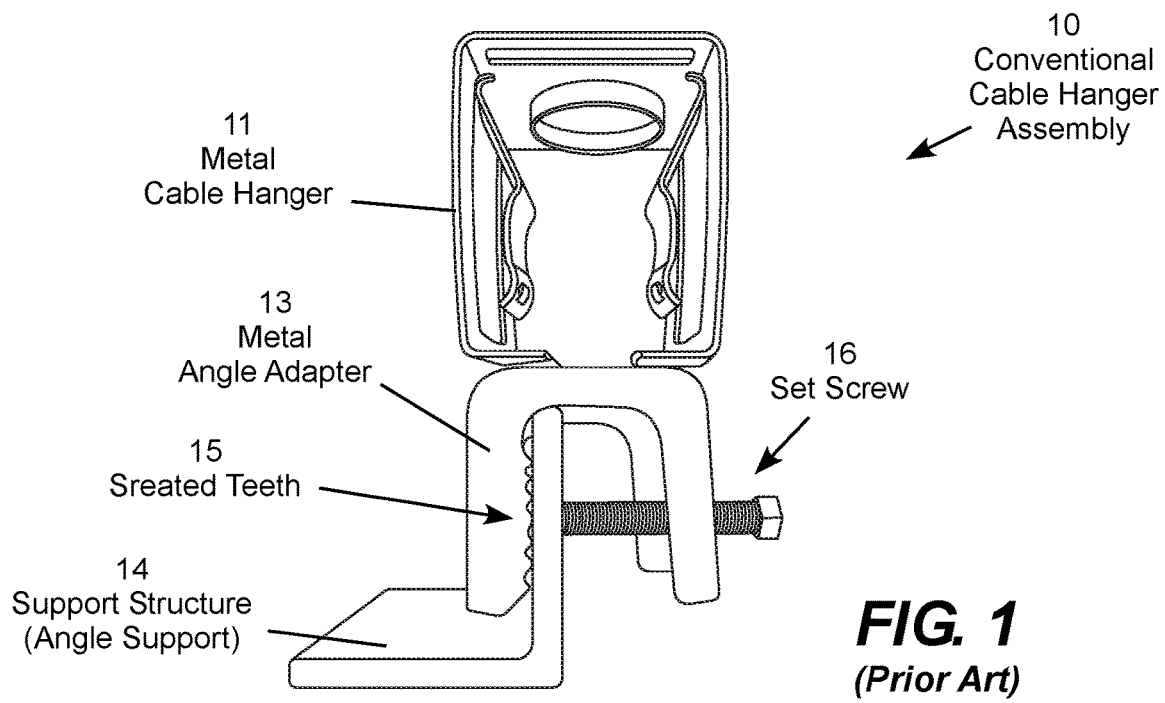
FIG. 1 is a side view of a conventional cable hanger assembly.
Figure 2:
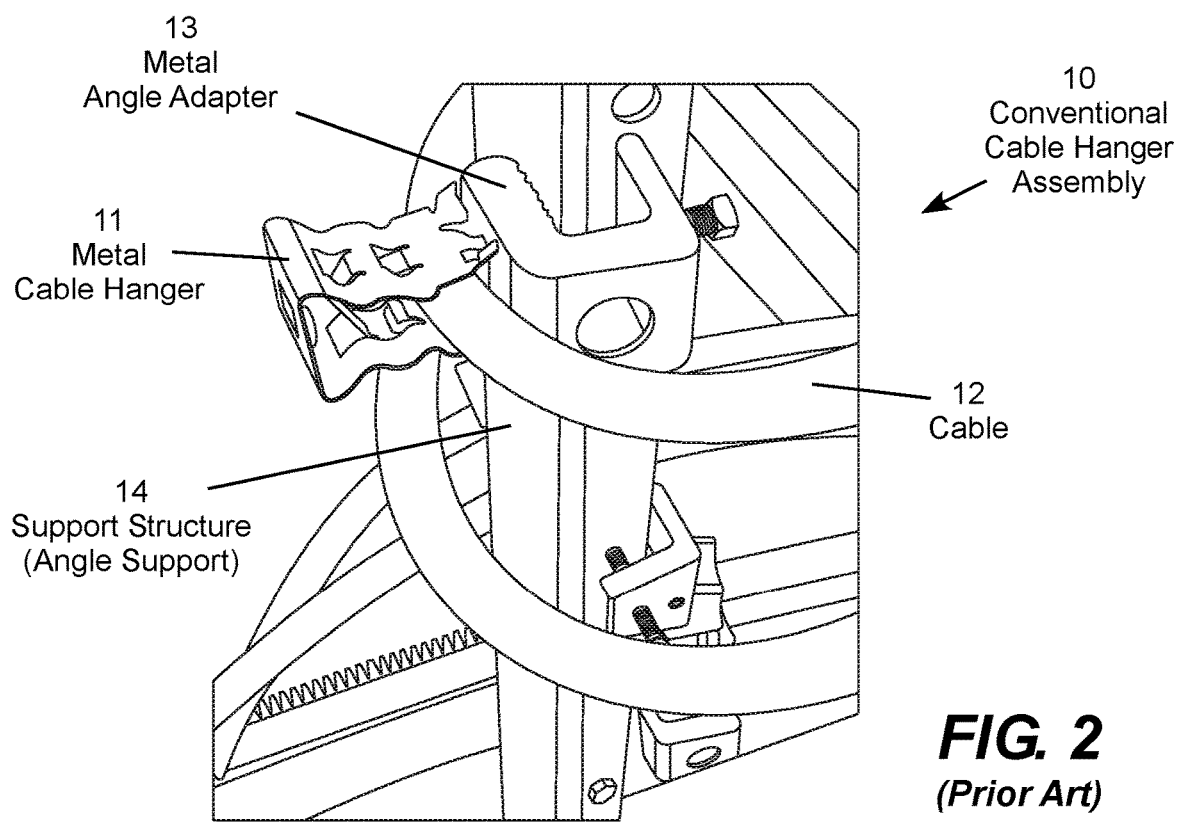
FIG. 2 is a perspective view of the conventional cable hanger assembly.

Embodiments of the invention may be embodied in a low passive intermodulation (PIM) system of universal bases and associated end effectors, including cable hangers and cable hanger interfaces that support one or more cable hangers. The system includes several types of universal bases represented by the universal pole base and the universal angle base shown in the illustrative embodiments. Each universal base includes a standard end effector receptacle integrally formed with a mounting adapter designed to attach to a support structure having a particular shape. For example, a first type of universal base includes an end effector receptacle integrally formed with a pole adapter, and a second type of universal base includes an end effector receptacle integrally formed with an angle adapter. Additional types of universal bases may be deployed, such a universal base with a flat mounting adapter designed to interface with a flat mounting structure, a universal base with a V-shaped mounting adapter designed to interface with a corner shaped mounting structure, and so forth.

The standard end effector receptacle is designed to receive a standard fitting integrally formed into a range of end effectors including cable hangers and cable hanger interfaces, such as a low-PIM barrel cable block, a junction box for receiving snap-in cable hangers, a low-PIM dual-rod cable hanger, multi-hanger interfaces, and so forth. The junction box receives low-PIM snap-in stackable cable hangers as well as older style metal snap-in cable hangers and multi-hanger interfaces. Heavy duty cable ties are used to attach a variety of cable hangers and cable hanger interfaces to the standard end effector receptacle, such as those described in U.S. Pat. Nos. 10,724,655, 10,637,229, 10,734,719; U.S. Pub. Nos. 2020-0109800; and U.S. patent application Ser. No. 16/856,802; which are incorporated by reference. The cable hangers and interfaces described in these references can generally be attached to a junction box that includes a fitting designed to be received in the standard end effector receptacle of the universal bases of the embodiments described below. In addition, the cable hangers and interfaces described in these references can typically be modified to include a fitting designed to be received directly into the standard end effector receptacle of the universal bases of the embodiments described below.

The innovative cable hanger assemblies improve upon conventional cable hanger assemblies by eliminating the known sources of PIM interference created by the conventional cable hanger assemblies in the potential PIM reactive zones near cellular base station antennas. Embodiments of the invention further improve over conventional cable hanger assemblies by providing a highly flexible, modular system of universal bases that interchangeably mix and match with a range of cable hangers, junction boxes, and other interfaces to create a wide range of cable hanger assemblies. In particular, the same cable hangers, junction boxes, and other interfaces can each attach to multiple types of universal bases, that are each designed to attach to a support structure with a different shape, eliminating the need to inventory different cable hangers, junction boxes and other interfaces for each type of support structure.

Generally described, the innovative cable hanger assemblies exhibit low-PIM performance because the angle adapter is made from or coated with a polymeric material that eliminates points of metal-to-metal contact that can generate PIM. While the low-PIM cable hanger assemblies can be utilized in any desired location, they are effective for mitigating PIM interference when deployed in the potential PIM reactive zone near a base station antenna. Although PIM generation is a function of the antenna broadcast frequency and power, equipment specifications may use a standard distance, such as 10-feet from the antenna, to establish the potential PIM reactive zone where PIM mitigation is considered to be appropriate. In other cases, the potential PIM reactive zone may be defined relative to the wavelength of the antenna's operational frequency, such as within one or two wavelengths of the downlink (main beam) frequency channel of the antenna.

The cables extending from the base station antenna and associated equipment are typically routed and secured to mounting structures in the potential PIM reactive zone. Even though the cables are typically routed behind the main beam of the antenna, enough RF energy can be present in this region to excite non-linear objects and generate PIM interference. For this reason, all directions from the base station within a standard distance, such as 10-feet from the antenna, may be considered to be within the potential PIM reactive zone. In conventional cell sites, metal cable hangers and associated hardware for supporting RF, optical, ground and remote electrical tilt ("RET") cables located in the potential PIM reactive zone behind base station antennas are common locations of loose metal-to-metal contact that can generate significant levels of PIM.

A representative embodiment includes a low-PIM universal base and associated cable hangers, junction boxes and other cable hanger interfaces fabricated from UV stable, injection molded, glass filled nylon to eliminate metal-to-metal contact between metal support structures and metal cable hangers. A first type of universal base includes an angle adapter that fits snugly onto a typical 0.25-inch (6.4 mm) thick angle support or other support structure to position the angle adapter on the support structure and prevent the adapter from rotating when the attachment hardware is tightened. A second type of universal base includes a pole adapter with stand-off features that allow the same universal base to securely mount to the poles of different diameter. Each low-PIM universal base also includes molded-in cable tie slots to position and locate one or more heavy duty, weather resistant plastic cable ties to firmly secure the universal base to the support structure. The angle adapters may be fabricated, for example, from injection molded, glass filled nylon. The universal bases may alternatively be fabricated from other suitable polymeric materials, such as ASB (acrylonitrile butadiene styrene), Acetal or POM (polyoxymethylen), PC (polycarbonate), PVC (polyvinyl chloride), and the like. Alternatively, a metal universal base body may be coated with a suitable polymeric material, such as PVC, natural or synthetic rubber, urethane, acrylic, epoxy, or the like. The universal bases are also amenable to other suitable fabrication processes, such as compression molding, 3D printing, and so forth. Cable hangers and interfaces made from a variety of materials, including metal and polymeric materials, may be configured to interface with the universal bases. While the universal base attaches most securely to cable hangers, junction boxes and other interfaces that have standard fittings specifically shaped to mate with the standard end effector receptacle of the universal base, devices with other shapes that don't have specifically designed fittings may often be securely attached to a universal base with heavy duty cable ties.

Figure 3:
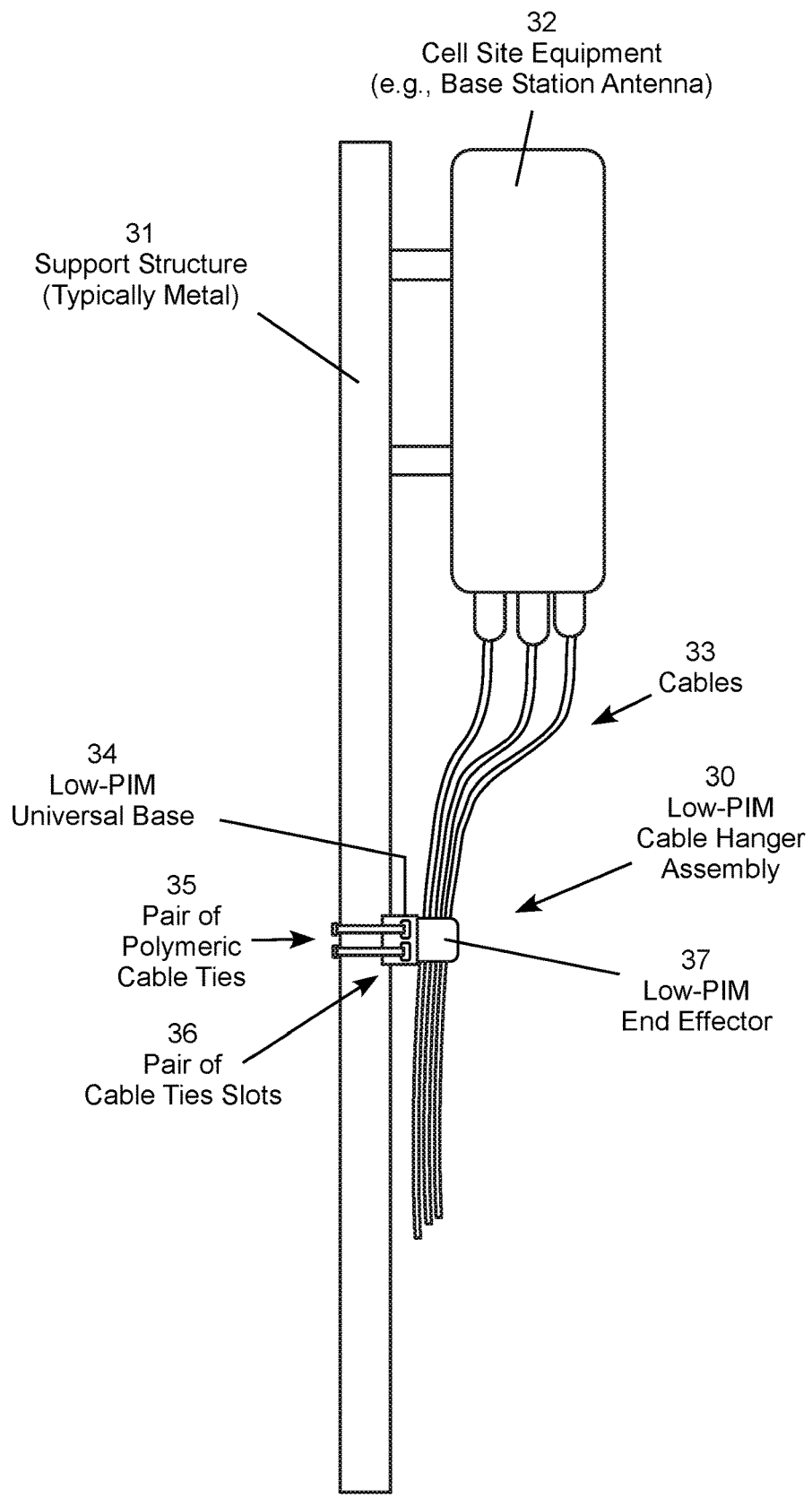
FIG. 3 is a conceptual side view of a cellular equipment site including a low-PIM cable hanger assembly.

FIG. 3 is a side view of a portion of a cell site using a representative low-PIM cable hanger assembly 30. The illustrated portion of the cell site includes a support structure 31 and supporting cell site equipment, in this example a base station antenna 32 from which a number of cables 33 extend. The low-PIM cable hanger assembly 30 is attached to the support structure 31 in position to support the cables 33 at a metal interface location, such as a metal pole support or a metal angle support portion of the support structure. The low-PIM cable hanger assembly 30 can be used to support cables extending from any other type of cell site equipment, such as an antenna, radio, amplifier, diplexer, filter and so forth. The low-PIM cable hanger assembly 30 avoids generating PIM through the use of polymeric (non-metallic) components. This example includes a low-PIM universal base 34 and a low-PIM end effector 37 that the coaxial cables 33 pass through. In this example, a pair of polymeric cable ties 35 pass through a pair of cable tie slots 36 in the universal base, around or through a portion of the low-PIM end effector 37, and around or through a portion of the support structure 31 to attach the universal base and the end effector to the support structure 31. For example, the cable ties 35 may pass through the pair of cable tie slots 36 in the universal base 34, around a side, within grooves, or through cable tie slots in the end effector, and around or through cable tie slots in a pole or angle support, to attach the universal base and the end effector to the pole or angle support. In another embodiment, a second set of polymeric cable ties passes through the cable tie slots 36 and around all or a portion of the end effector 37 to attach the end effector to the universal base 34.

In different embodiments, a different number of cable ties, such as one, two, three or more cable ties may be used to attach the universal base and the end effector to the support structure. More generally stated, FIG. 3 shows an embodiment in which a universal base includes at least one cable tie slot that receives at least one cable tie to secure the universal base and the end effector to the support structure. The end effector may directly or indirectly support one or more cables. For example, the end effector may be a cable hanger or an interface that attaches one or more cable hangers to the universal base. In the example shown in FIG. 3, the low-PIM end effector 37 is a cable block that directly supports the cables 31. In other embodiments, an interface received within universal base receives one or more cable hangers. For example, a cable hanger spacer or a multi-hanger interface, such as a mounting plate, square junction box, rectangular junction box, trapezoidal junction interface may be interchangeably received in the universal base as described in U.S. Pat. No. 10,724,655 modified to include a fitting shaped to be received within universal base. A cable tie (or set of cable ties) passes through the cable tie slot (or set of cable tie slots) of the universal base and around a portion of the support structure to attach the universal base to the support structure. The same cable tie (or set of cable ties), or a second cable tie (or set of cable ties), passes through the same cable tie slot (or set of cable tie slots) or a different cable tie slot (or set of cable tie slots) in the universal base and around the end effector or a portion of the end effector (e.g., a cable tie slot, cable tie groove or wall portion) to secure the end effector to the universal base.

While the illustrated polymeric universal base 34 is shown attached to an upright pole or angle support, it may be configured to attach to any suitable bracket or other support structure in any orientation, such as a bracket with a square cross-section, a wall, a floor, a building ledge, and so forth. Alternate embodiments may utilize one or more fastener rods that may generally be polymeric or metal. Polymeric nuts may be used with a metal fastener rod, and a polymeric snap-in fastener may be suitable when connecting the mounting bracket to a metal part, such as a metal interface bracket, to avoid a metal-to-metal contact point at the interface between the fastener and the metal interface bracket.

FIGS. 4A, 4B and 5-7 show several representative embodiments to illustrate the broader universal cable hanger system that includes different types of universal bases and different types of end effectors including cable hangers and cable hanger interfaces. Multi-hanger interfaces are represented in the illustrated embodiments by the junction box 55 shown FIG. 5. Other types of single-hanger and multi-hanger interfaces are shown in incorporated references, which can be readily modified to include a fitting designed to be received within a universal base. For example, single-hanger interfaces are described in U.S. Pub. No. 2020-0109800 and multi-hanger interfaces are described in U.S. Pat. No. 10,724,655 and the cable support rail system described in U.S. Pat. No. 10,734,719. The universal cable hanger system advantageously allows the universal bases, cable hangers, and cable hanger interfaces to be mixed and matched interchangeably to create additional alternative embodiments.

Figure 4A:
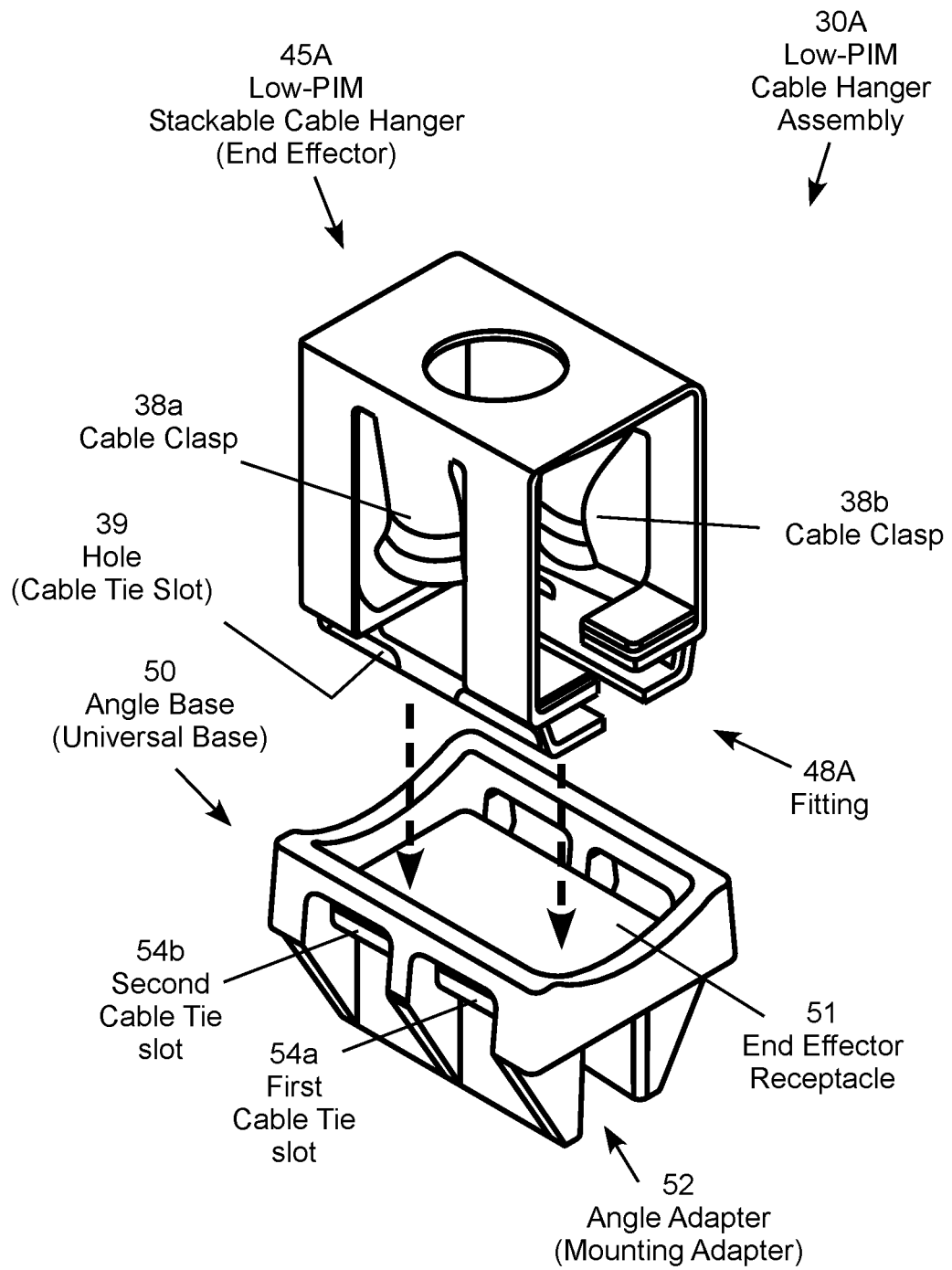
FIG. 4A is an exploded perspective view of an example low-PIM cable hanger assembly including a universal angle base and a low-PIM stackable cable hanger.

FIG. 4A is an exploded perspective view of another example low-PIM cable hanger assembly 30A including a universal base, in this example an angle base 50, and a low-PIM stackable cable hanger 45A. The angle base 50 includes a mounting adapter, in this example an angle adapter 52, designed to fit snugly on a typical ¼-inch (6.4 mm), 5/16-inch (7.9 mm) or 3/8-inch (9.5 mm) thick angle support or other support structure to position the angle adapter on the support structure and prevent the adapter from rotating when the attachment hardware is tightened, as described in U.S. patent application Ser. No. 16/856,802. The angle base 50 also includes a pair of cable tie slots 54a and 54b that are used to attach the angle base to an angle support, and to attach the angle base directly or indirectly to one or more cable hangers.

The stackable cable hanger 45A includes a pair of cable clasps 38a, 38b used to receive a cable as described in U.S. Pat. No. 10,637,229 modified to include the fitting 48A that fits snugly into the end effector receptacle 51 of the angle base 50. In this example, cable ties extending through the pair of cable tie slots 54a and 54b extend around the central portion of the fitting 48A to attach the stackable cable hanger 45A to the angle base 50. The fitting 48A may include four holes, represented by the enumerated hole 39, forming a pair of cable tie slots through the fitting 48A used to secure the stackable cable hanger 45A to the angle base 50. In this embodiment, the same cable ties are used to attach the angle base 50 and the stackable cable hanger 45A to each other, and to attach the angle base to an angle support. Because the universal base and cable ties are polymeric, conventional metal cable hangers modified to include a fitting configured to fit in the standard end effector receptacle may be used instead of the stackable cable hanger 45A shown in FIG. 4A if desired. A conventional metal cable hanger may also be connected to the universal base 50 by way of a low-PIM spacer as described in U.S. patent application Ser. No. 16/856,802 modified to include a fitting configured to fit in the standard end effector receptacle 51.

Figure 4B:
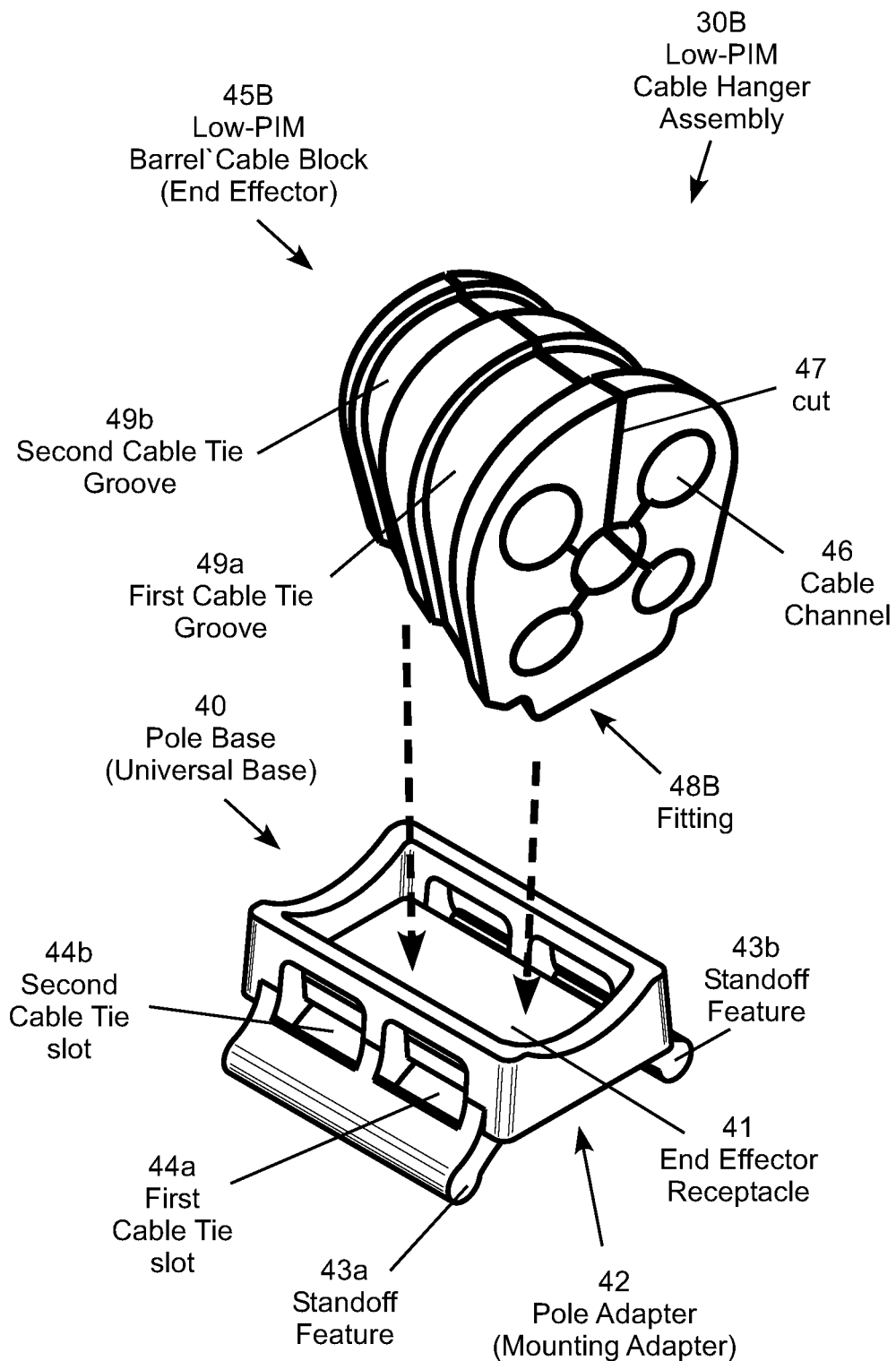
FIG. 4B is an exploded perspective view of an example low-PIM cable hanger assembly including a universal pole base and a low-PIM barrel cable block.

FIG. 4B is an exploded perspective view of an example the low-PIM cable hanger assembly 30B including a universal base, in this example a pole base 40, that receives an end effector, in this example the low-PIM barrel cable block 45B. The pole base 40 includes an end effector receptacle 41 integrally formed with a mounting adapter, in this example a pole adapter 42. The end effector receptacle 41 is shaped to receive a standard fitting 48B included on a range of cable hangers and interfaces that support one or more cable hangers. The pole adapter 42 includes a pair of standoff features 43a and 43b that allow the pole adapter to securely attach to the poles with a range of different diameters as described in U.S. Pat. No. 10,724,655. The pole base 40 also includes a pair of cable tie slots 44a and 44b that receive respective cable ties to secure the pole base directly or indirectly to one or more cable hangers. In this example the low-PIM barrel cable block 45B received in the pole base directly supports several cables. In other embodiments, a multi-hanger interface received within the pole base 40 receives multiple cable hangers. For example, a different end effector, the junction box 55 shown in FIG. 5, may also be received in the pole base 40. In the embodiment shown in FIG. 4B, a first pair of cable ties extend through the pair of cable tie slots 44a and 44b and around the low-PIM barrel cable block 45B to attach the low-PIM barrel cable block to the pole base 40, while a second pair of cable ties extend through the pair of cable tie slots and around a portion of a pole support to secure the pole base to the pole support.

The low-PIM barrel cable block 45B includes a number of cable channels represented by the enumerated cable channel 46 that are each sized to receive and support a respective coaxial cables. The cable channels may include flexible vanes or adapters to allow the same size hole to support cables with different diameters. The low-PIM barrel cable block 45B is fabricated from a rubber-like flexible material with a number of cuts represented by the enumerated cut 47 that allow the low-PIM barrel cable block to bend to enter the cables into the cable channels. The low-PIM barrel cable block 45B also includes a fitting 48B shaped to fit snugly into the end effector receptacle 41. For all of the embodiments, the snug fit is not necessary but it is desirable because a snug fit helps to avoid the end effector from falling out of the end effector receptacle during installation before the cable ties are installed to secure the components together. The exterior profile of the low-PIM barrel cable block 45B also includes a first cable tie groove 49a that aligns with the first cable tie slot 44a, and a second cable tie groove 49b that aligns with the second cable tie slot 44b, when the low-PIM barrel cable block is positioned in the pole base 40 with the fitting 48A received within the end effector receptacle 41. The cable tie grooves 49a, 49b help stabilize the cable hanger assembly 30B and prevent the cable ties from slipping out of place on the external surface of the low-PIM barrel cable block 45B. The same groove alignment is present when the low-PIM barrel cable block 45B is positioned in an angle base 50 or another type of universal base.

Figure 5:
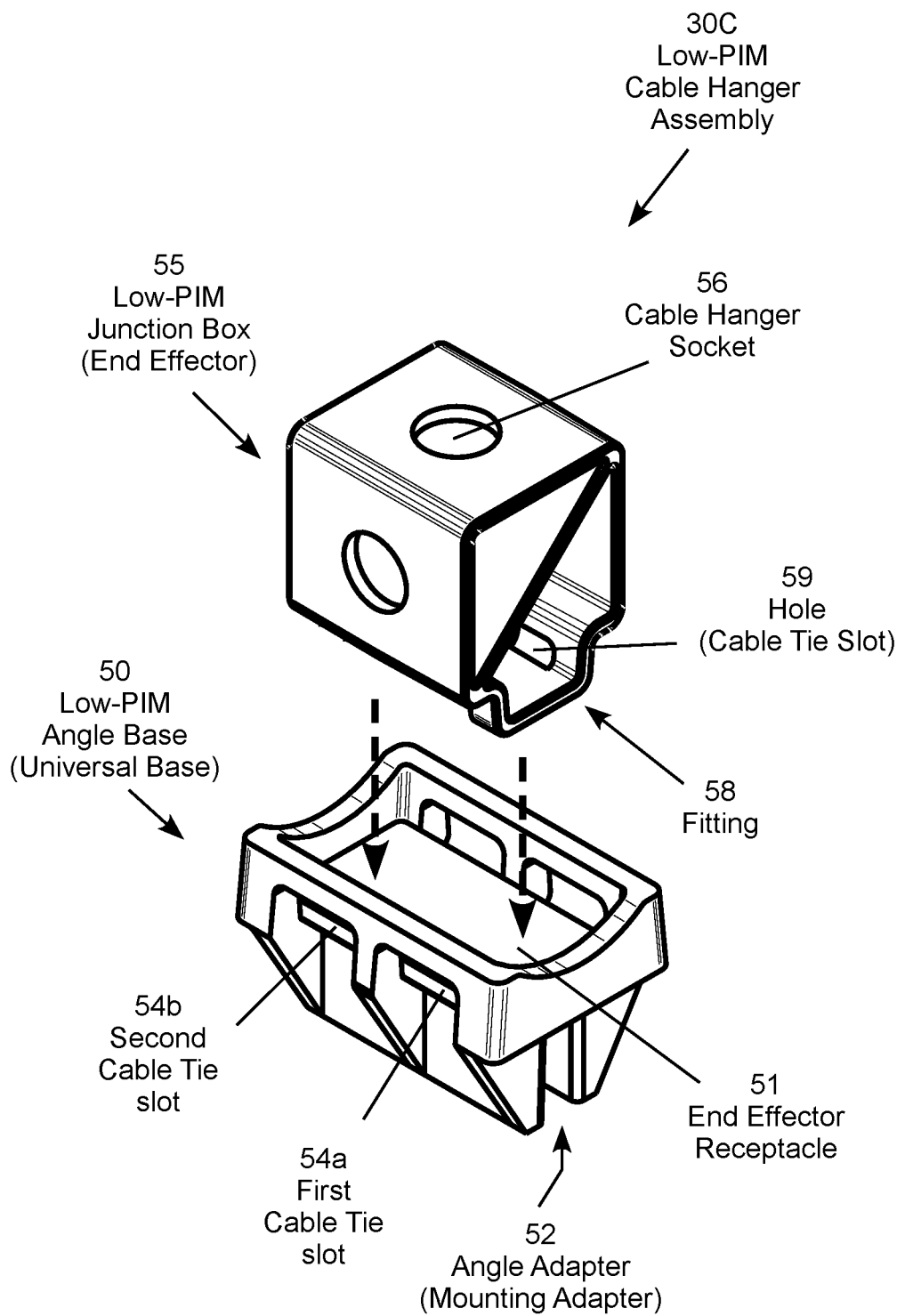
FIG. 5 is an exploded perspective view of another example low-PIM cable hanger assembly including a universal angle base and a junction box.

FIG. 5 is an exploded perspective view of another example low-PIM cable hanger assembly 30C including a universal base, in this example an angle base 50, and a low-PIM junction box 55. The junction box 55 includes three cable hanger sockets represented by the enumerated cable hanger socket 56. Each cable hanger socket is sized to receive a respective metal snap-in cable hanger, a low-PIM snap-in stackable cable hanger, or another cable hanger interface, for example as described in U.S. Pat. Nos. 10,724, 655, 10,637,229, 10,734,719; U.S. Pub. Nos. 2020-0109800; and U.S. patent application Ser. No. 16/856,802. The junction box 55 also includes a fitting 58 shaped to fit snugly into the end effector receptacle 51. Four holes, represented by the enumerated hole 59, form a pair of cable tie slots through the fitting 58 used to secure the junction box 55 to the angle base 50. More specifically, a pair of cable ties extending through the pair of cable tie slots 54a and 54b through the angle base 50, and extending through the cable tie slots through the fitting 58 of the junction box 55, secure the angle base and the junction box to an angle support. In this embodiment, the same cable ties are used to attach the angle base 50 and the junction box to each other, and to attach the angle base to an angle support.

Figure 6:
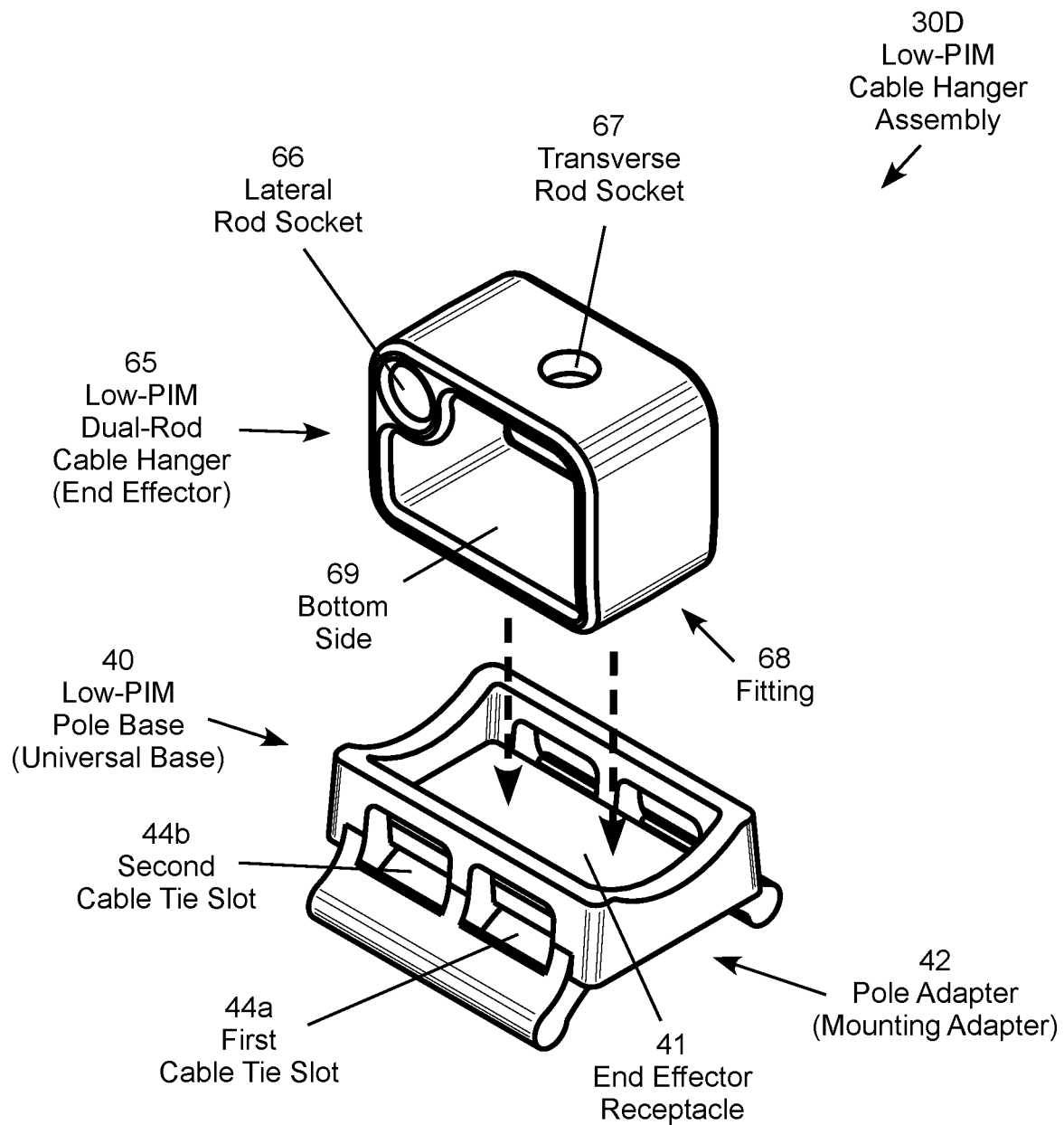
FIG. 6 is an exploded perspective view of another example low-PIM cable hanger assembly including a universal pole base and a low-PIM dual-rod cable hanger.

FIG. 6 is an exploded perspective view of another example low-PIM cable hanger assembly 30D including a universal base, in this example a pole base 40, that receives an end effector, in this example a low-PIM dual-rod cable hanger 65. The low-PIM dual-rod cable hanger 65 includes a lateral rod socket 66 and a transverse rod socket 67 that can be used to attach threaded rods to the low-PIM dual-rod cable hanger. The threaded rods, in turn, can be used to attach one or more cable hangers directly or indirectly to the low-PIM dual-rod cable hanger, as described in U.S. patent application Ser. No. 16/856,802. The low-PIM dual-rod cable hanger 65 also includes a fitting 68 shaped to fit snugly into the end effector receptacle 41. Cable ties extending through the cable tie slots 44a, 44b pass around the bottom side 69 of the low-PIM dual-rod cable hanger 65 to secure the fitting 68 in the end effector receptacle 41.

FIGS. 7A-7C illustrate assembly of a representative low-PIM cable hanger assembly 70 that includes a universal base and an end effector that attaches to the universal base. The technician selects an appropriate universal base for the installation, in this example a pole base 40. The technician positions the selected pole base 40 in a desired location on a selected support structure, in this example with the stand-off features 43a and 43b of the pole adapter 42 placed against a pole support 71 as shown in FIG. 7B. The technician then places a desired end effector with its fitting inserted into the end effector receptacle of the pole base. In this example, the technician positions a junction box 55 with its fitting 58 inserted into the end effector receptacle 41 of the pole base 40 as shown in FIG. 7C. The technician then positions a pair of cable ties 72a, 72b through respective cable tie slots 44a, 44b through the pole base 40 and through respective cable tie slot 59a, 59b through the fitting 58 of the junction box 55. The technician then extends the cable ties 72a, 72b around the pole support 71 and tightens them to secure the pole base 40 and the junction box 55 to the pole support. The technician then positions one or more snap-in cable hangers around a cable and snaps the cable hanger into a receptacle hole of the junction box 55 to secure the cable. The technician may then repeat as desired to secure additional cables. The technician may also or alternatively snap a multi-hanger interface into one or more of the receptacle holes to secure additional cables.

Figure 8A:
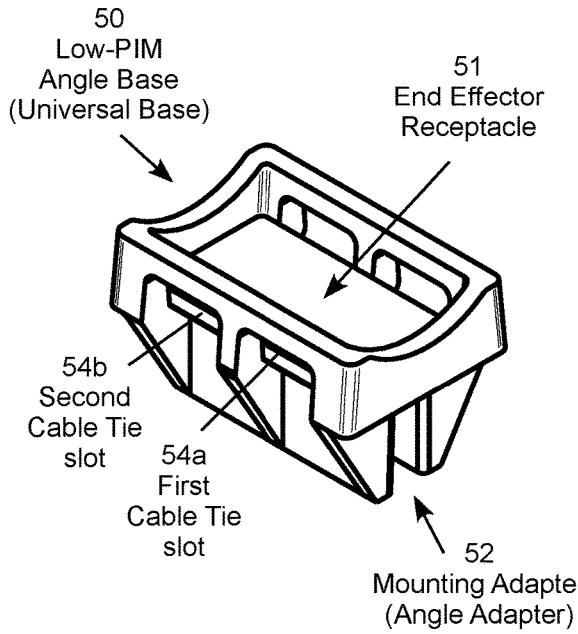
FIG. 8A is a perspective view of a universal angle base.
Figure 8B:
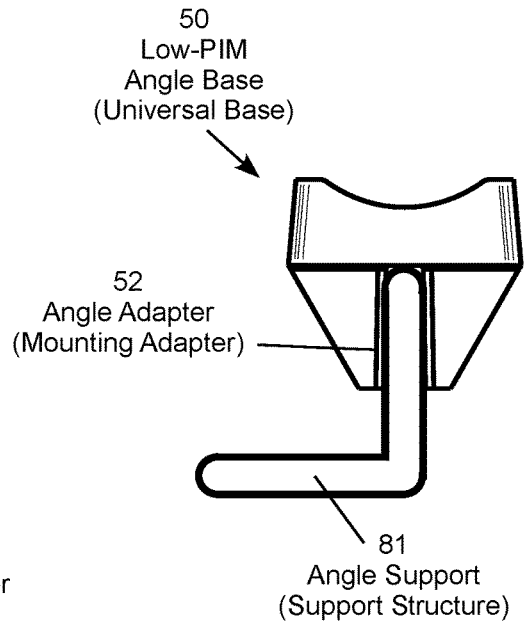
FIG. 8B is a side view of the angle base interfacing with an angle support.
Figure 8C:
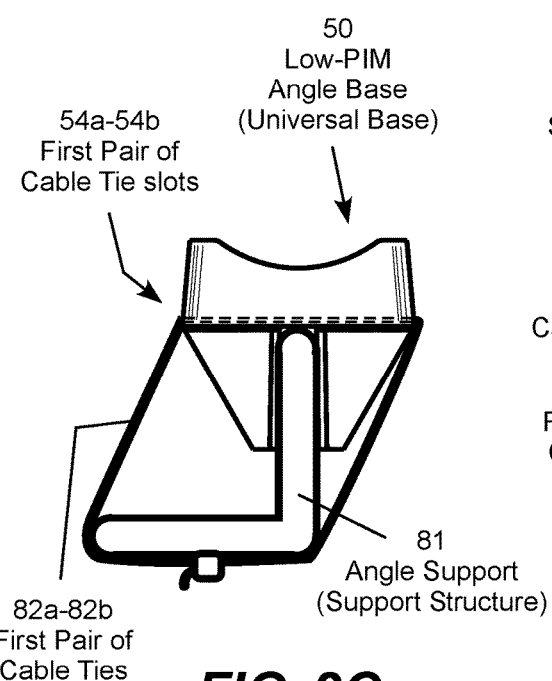
FIG. 8C is a side view of the angle base attached to the angle support with a first pair of cable ties.
Figure 8D:
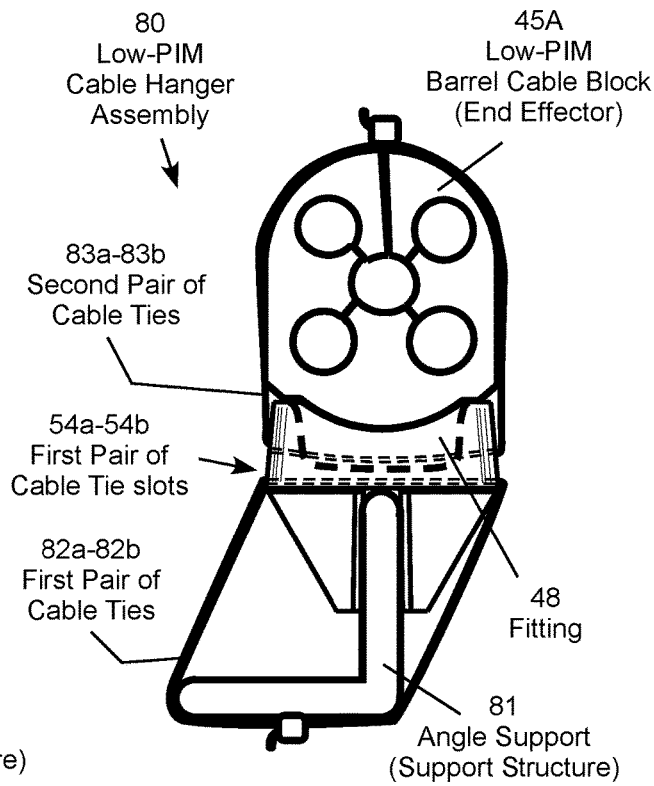
FIG. 8D is a side view of the angle base attached to the angle support with a first pair of cable ties and with a barrel cable block attached to the angle base with a second pair of cable ties.

FIGS. 8A-8D illustrate assembly of another representative low-PIM cable hanger assembly 80 that includes a universal base and an end effector that attaches to the universal base. The technician selects an appropriate universal base for the installation, in this example an angle base 50. The technician positions the selected angle base 50 in a desired location on a selected support structure, in this example with the angle adapter 52 fitting snugly on an angle support 81 as shown in FIG. 8B. The technician then positions a first pair of cable ties 82a, 82b through respective cable tie slots 54a, 54b through the angle base 50. The technician then extends the cable ties 82a, 82b around the angle support 81 and tightens them to secure the angle base 50 to the angle support as shown in FIG. 8C. The technician then positions a low-PIM barrel cable block 45A with its fitting 48 inserted into the end effector receptacle 51 of the angle base 50. The technician then positions a second pair cable ties 83a, 83b through the cable tie slots 54a, 54b and around the low-PIM barrel cable block 45A positioning the cable ties in the groves 49a, 49b. At some point prior to tightening the second pair cable ties 83a, 83b, the technician inserts cables to be secured into the low-PIM barrel cable block 45A. The technician then tightens the cable ties 83a, 83b to secure the low-PIM barrel cable block and associated cables to the angle base 50 as shown in FIG. 8D.

Figure 9:
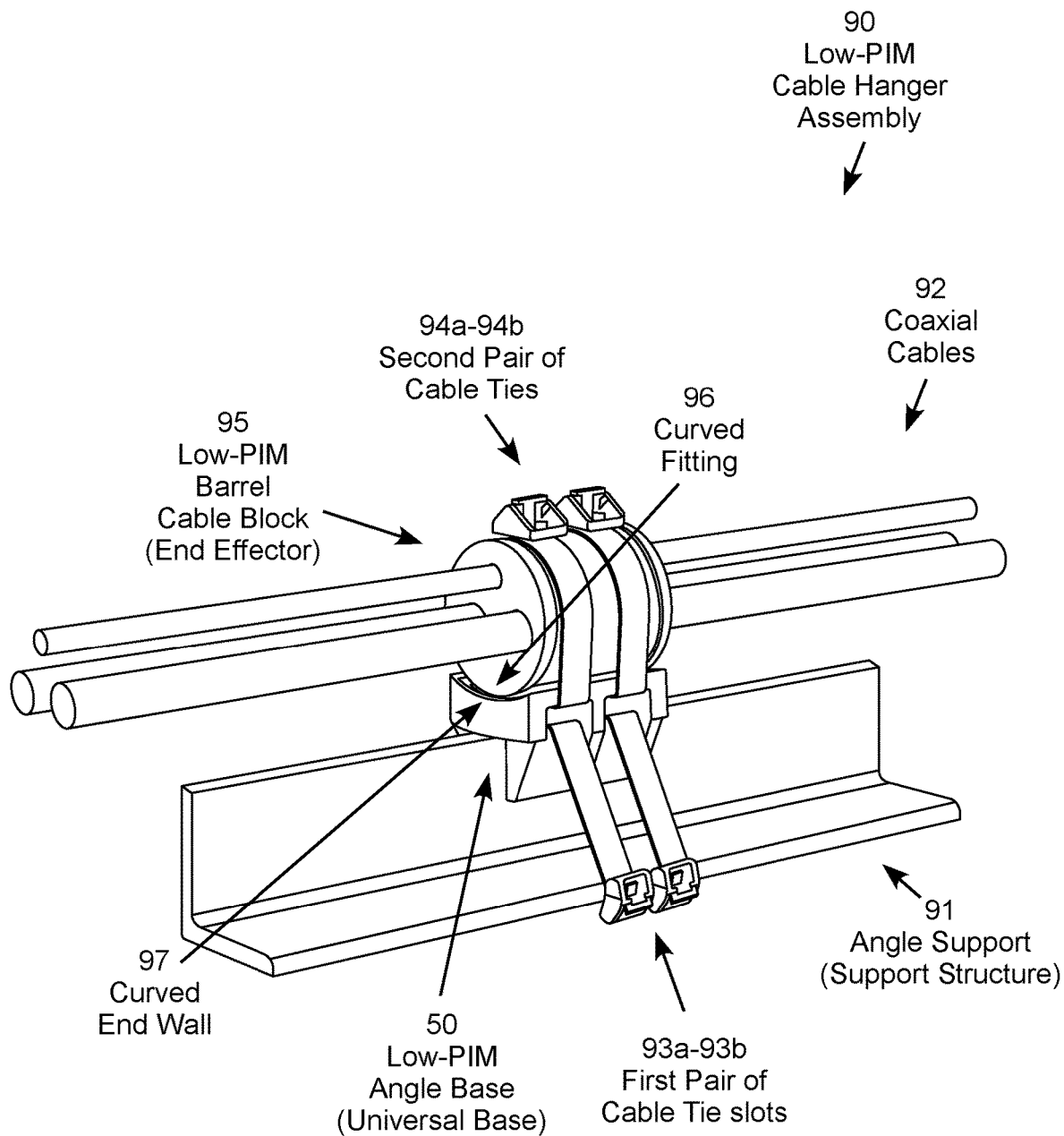
FIG. 9 is a perspective view of another low-PIM cable hanger assembly including a universal angle base and a low-PIM barrel cable block.
Figure 10:
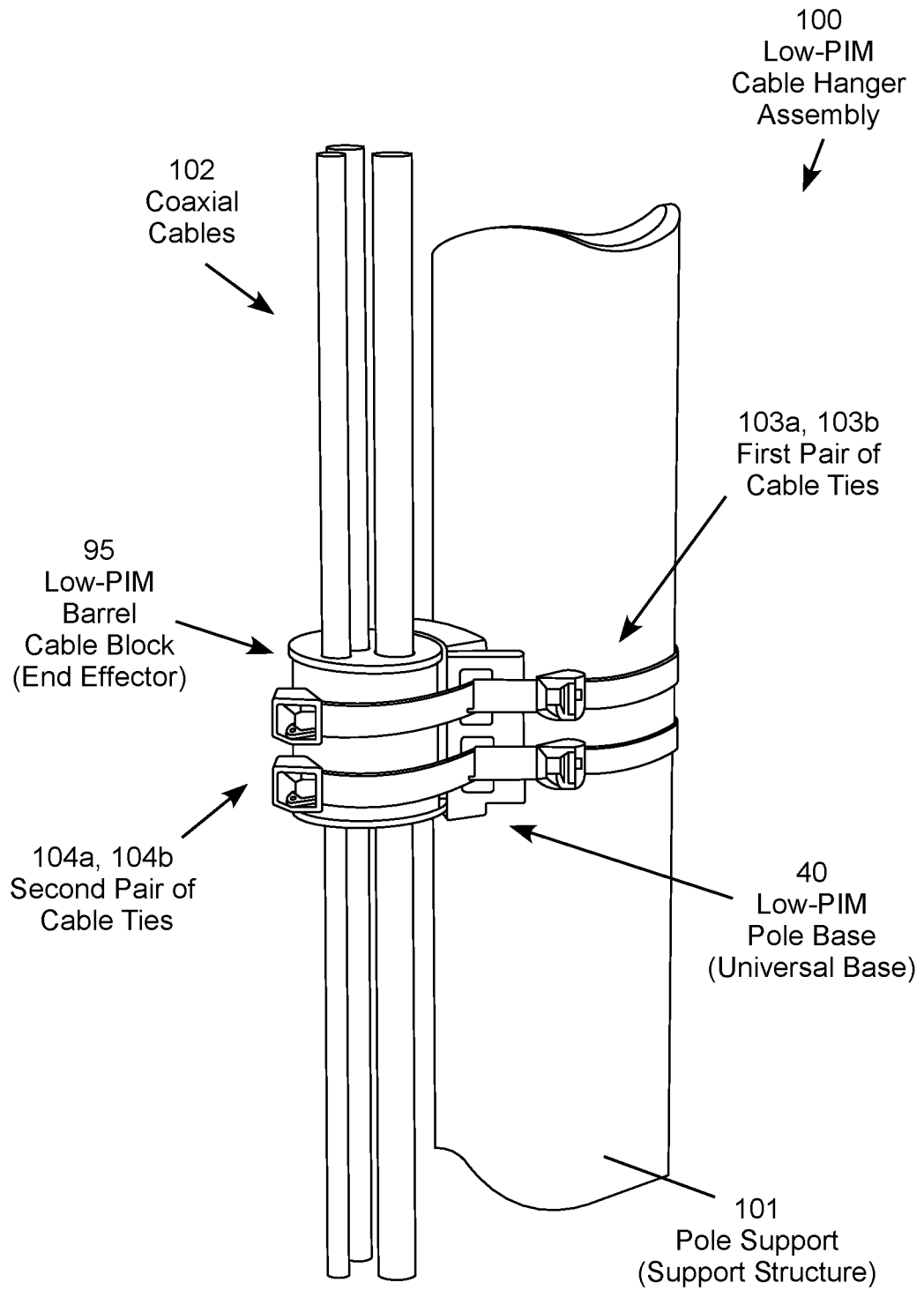
FIG. 10 is a perspective view of another low-PIM cable hanger assembly including a universal pole base and a low-PIM barrel cable block.

FIG. 9 is a perspective view of another low-PIM cable hanger assembly 90 including a low-PIM barrel cable block 95 and an angle base 50 attached to an angle support 91. The low-PIM barrel cable block 95 supports several cables 92. A first pair of cable ties 93a, 93b secures the angle base 50 to the angle support 91, and a second pair of cable ties 94a, 94b secures the low-PIM barrel cable block 95 to the angle base 50. FIG. 10 is a perspective view of another low-PIM cable hanger assembly 100 including the low-PIM barrel cable block 95 and a pole base 40 attached to a pole support 101. The low-PIM barrel cable block 95 supports several cables 102. A first pair of cable ties 103a, 103b secures the pole base 40 to the pole support 101, and a second pair of cable ties 104a, 104b secures the low-PIM barrel cable block 95 to the pole base 40. The cable block 95 shown in FIG. 9 and FIG. 10 does not have a box-shaped fitting shaped to interface with the box-shaped portion of the end effector receptacle of the universal base. Rather this style barrel cushion cable block 95 includes a curved fitting 96 shaped to interface with the curved end walls 97 of the end effector receptacle of the universal base.

Figure 11:
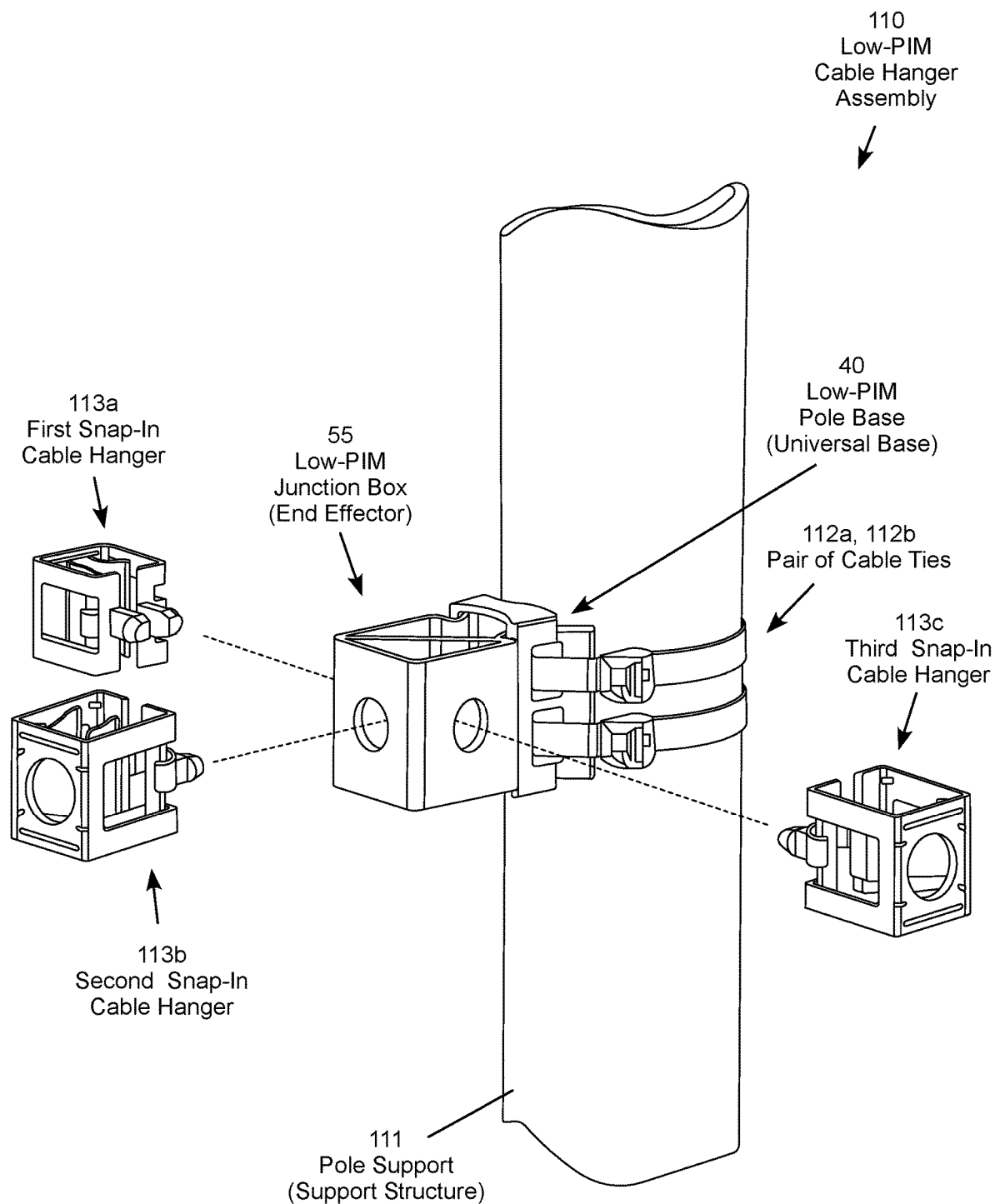
FIG. 11 is a perspective view of another low-PIM cable hanger assembly including a universal pole base, a junction box, and three snap-in cable hangers.

FIG. 11 is a perspective exploded view of another low-PIM cable hanger assembly 110 including a junction box 55 and a pole base 40. A pair of cable ties 112a, 112b secures the pole base 40 to the junction box 55. The same pair of cable ties 112a, 112b also secures the pole base 40 to the pole support 111. The junction box 55 supports several snap-in cable hangers 113a, 113b and 113c. A technician positions each snap-in cable hanger around a cable and snaps the snap-in cable hanger into a receptacle hole of the junction box 55 to secure each cable. The technician may also or alternatively snap a multi-hanger interface into one or more of the receptacle holes to secure additional cables.

Figure 12A:
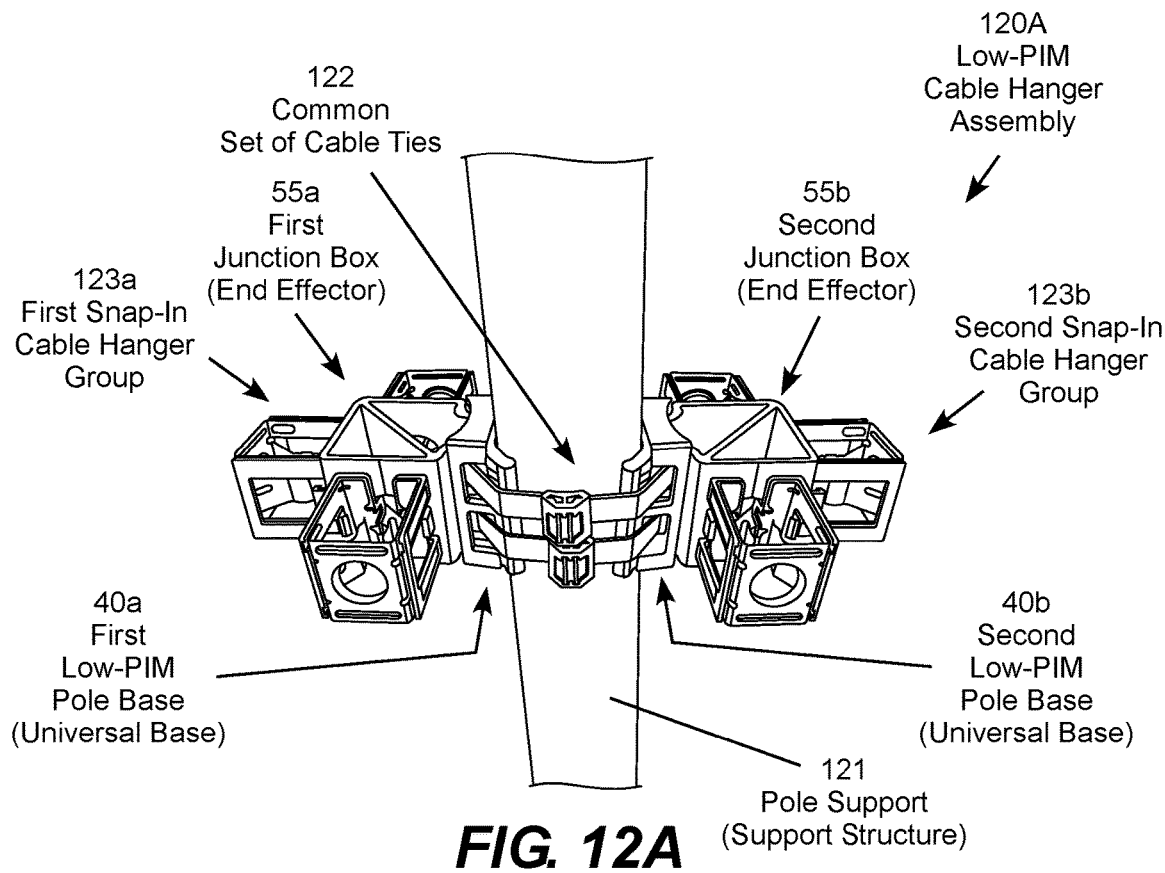
FIG. 12A is a perspective view of another low-PIM cable hanger assembly including two universal pole bases attached to a pole support with a common set of cable ties, two junction boxes, and two snap-in cable hanger groups.
Figure 12B:
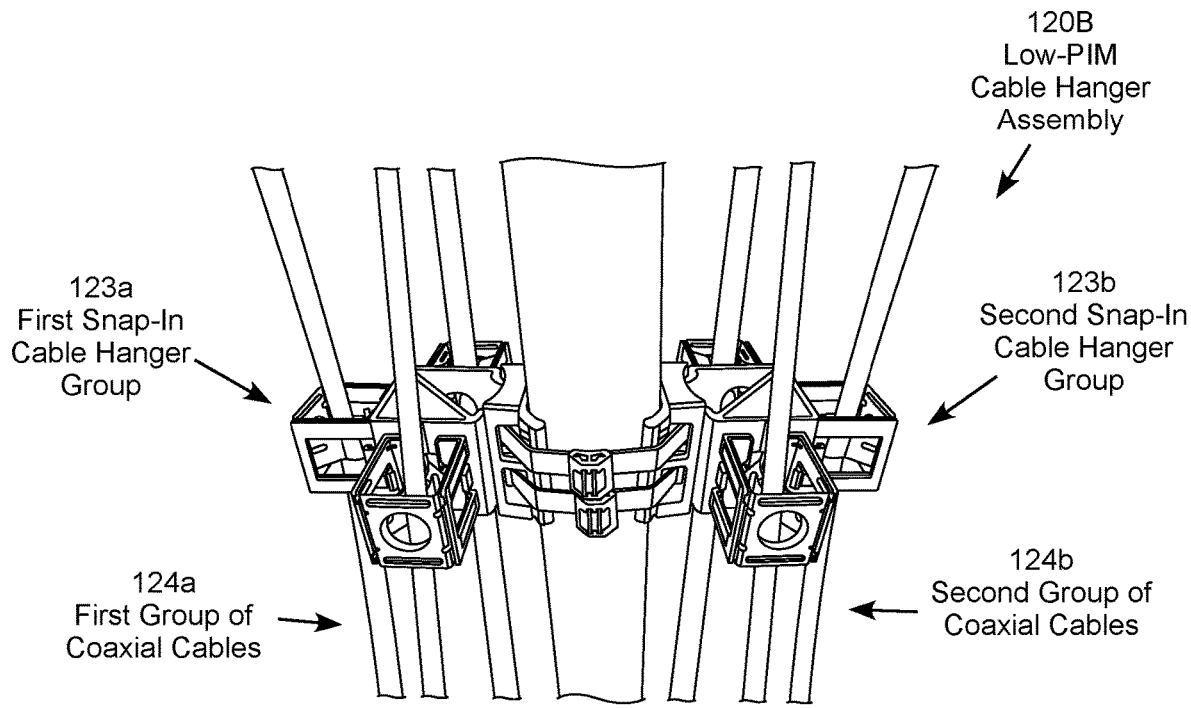
FIG. 12B is a perspective view of the low-PIM cable hanger assembly of FIG. 12A supporting two groups of coaxial cables.

FIG. 12A is a perspective view of another low-PIM cable hanger assembly 120A including two pole bases 40a and 40b and two junction boxes 55a and 55b with a common set of cable ties 122 attaching both pole bases and both junction boxes to a pole support 121. The first pole base 40a supports a first junction box 55a which, in turn, supports a first snap-in cable hanger group 123a similar to the cable hanger assembly 110 shown in FIG. 11. Similarly, the second pole base 40b supports a second junction box 55b which, in turn, supports a second snap-in cable hanger group 123b. FIG. 12B shows the cable hanger assembly 120B with each cable hanger group 123a, 123b supporting a respective group of coaxial cables 124a, 124b. This embodiment can be readily modified to other types of end effectors, including two different types of end effectors, with a common cable tie (or set of cable ties) at the same interface location on a support structure. This embodiment can also be modified to use a common cable tie (or set of cable ties) to attach two angle bases with orthogonal orientations to an angle support, which in turn attach any of the interchangeable types of end effectors, which in turn support the same or different cable (or sets of cables). Many different cable support arrangements can therefore be configured from the same set of standardized parts. For example, two angle bases with respective cable hangers (or cable hanger interfaces) attached to respective flanges of an angle support at the same interface location can be used to route a cable (or sets of cables) around a corner, and so forth.

Figure 13:
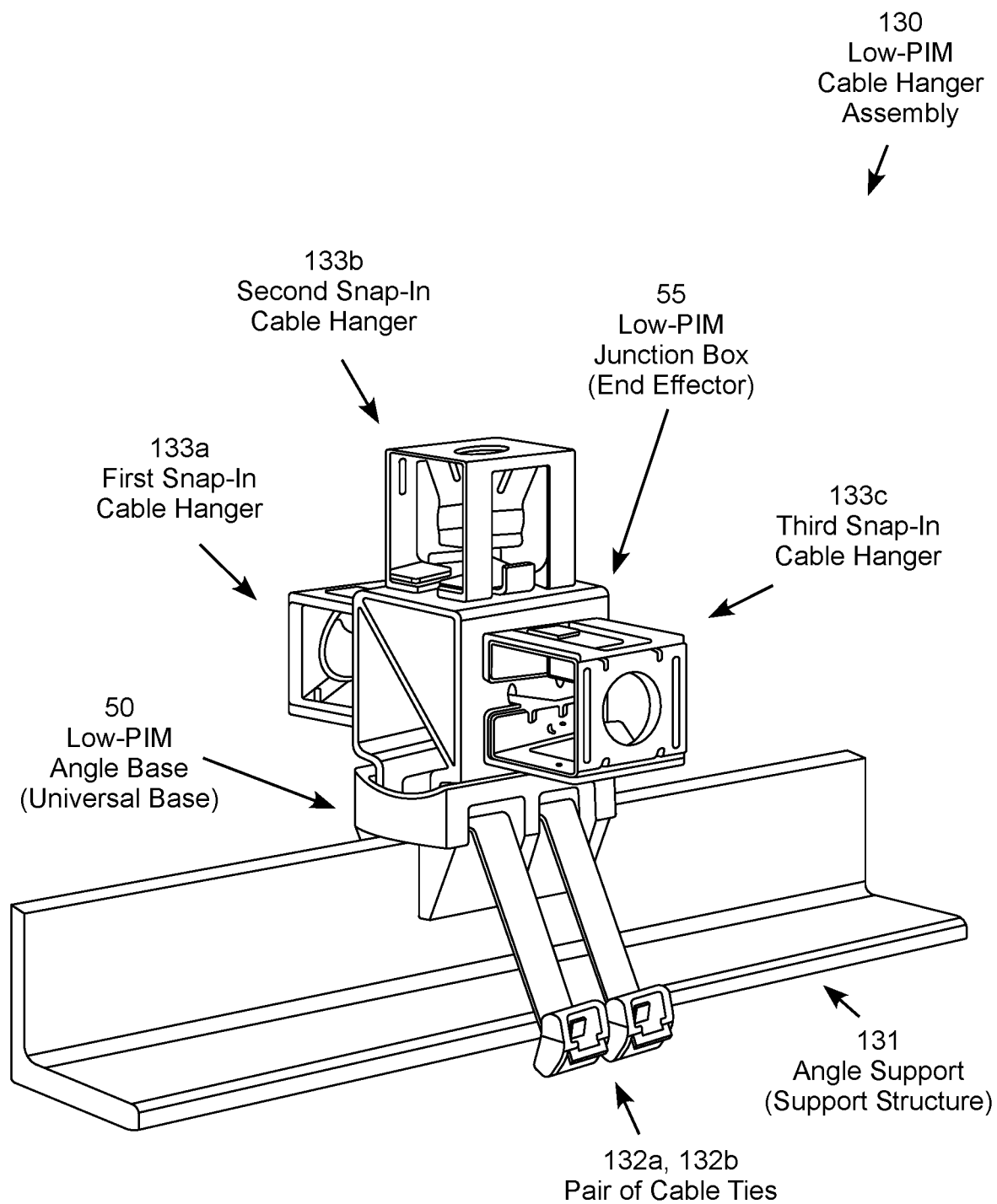
FIG. 13 is a perspective view of another low-PIM cable hanger assembly including a universal angle base, a junction box, and three snap-in cable hangers.

FIG. 13 is a perspective view of another low-PIM cable hanger assembly 130 including an angle base 50, a junction box 55, and three snap-in cable hangers 133a, 133b and 133c. This embodiment is similar to the cable hanger assembly embodiment 110 shown in FIG. 11 except that it includes an angle base 50 instead of a pole base 40. A pair of cable ties 132a, 132b secures the angle base 50 and the junction box 55 to an angle support 131. The junction box 55 supports several snap-in cable hangers 133a, 133b and 133c. A technician positions each snap-in cable hanger around a cable and snaps the snap-in cable hanger into a receptacle hole of the junction box 55 to secure each cable. The technician may also or alternatively snap a multi-hanger interface into one or more of the receptacle holes to secure additional cables.

Figure 14:
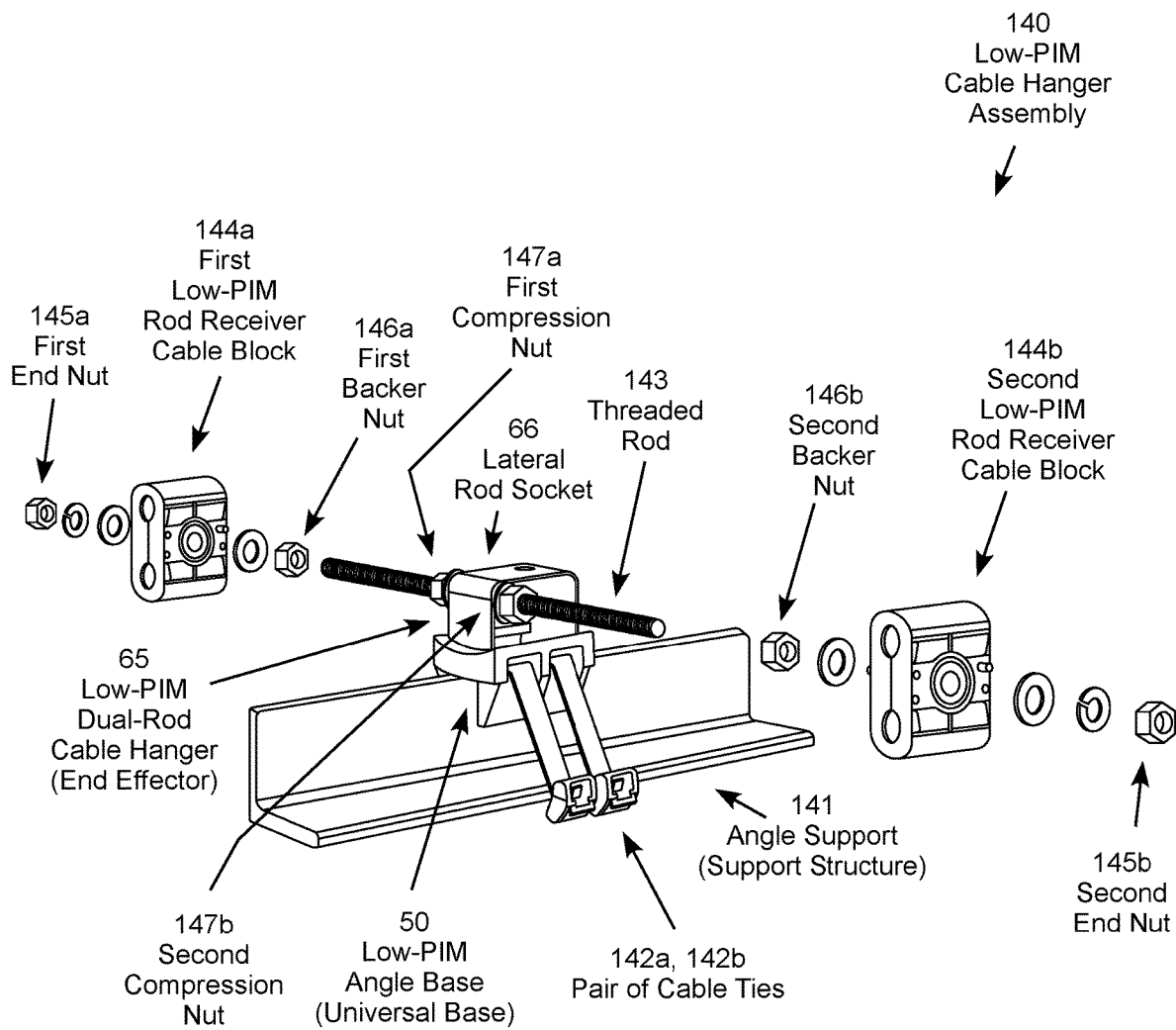
FIG. 14 is an exploded perspective view of another low-PIM cable hanger assembly including a universal angle base, a low-PIM dual-rod cable hanger, a threaded rod attached to a lateral rod socket of the low-PIM dual-rod cable hanger, and two low-PIM rod receiver cable blocks attached to the threaded rod.

FIG. 14 is an exploded perspective view of another low-PIM cable hanger assembly 140 including an angle base 50, a low-PIM dual-rod cable hanger 65, and a threaded rod 143 attached to the lateral rod socket 66 of the low-PIM dual-rod cable hanger. A pair of cable ties 142a, 142b secures the angle base 50 and the low-PIM dual-rod cable hanger 65 to an angle support 141. The threaded rod 143 supports two low-PIM rod receiver cable blocks 144a, 144b positioned on opposing sides of the low-PIM dual-rod cable hanger 65. Hardware allows each low-PIM cable block to be secured at a desired position along the threaded rod 143. In this example, the first low-PIM cable block 144a is secured between a first end nut 145 and a first backer nut 146a, while the second low-PIM cable block 144b is secured between a second end nut 145b and a second backer nut 146b. The low-PIM dual-rod cable hanger 65 is secured between first and second compression nuts 147a and 147b allowing the low-PIM rod receiver cable blocks 144a, 144b and the low-PIM dual-rod cable hanger 65 to be spaced apart, as desired, along the threaded rod 143. Additional hardware, such as the washers and lock washers not specifically enumerated, may also be included as a matter of design choice.

Figure 15:
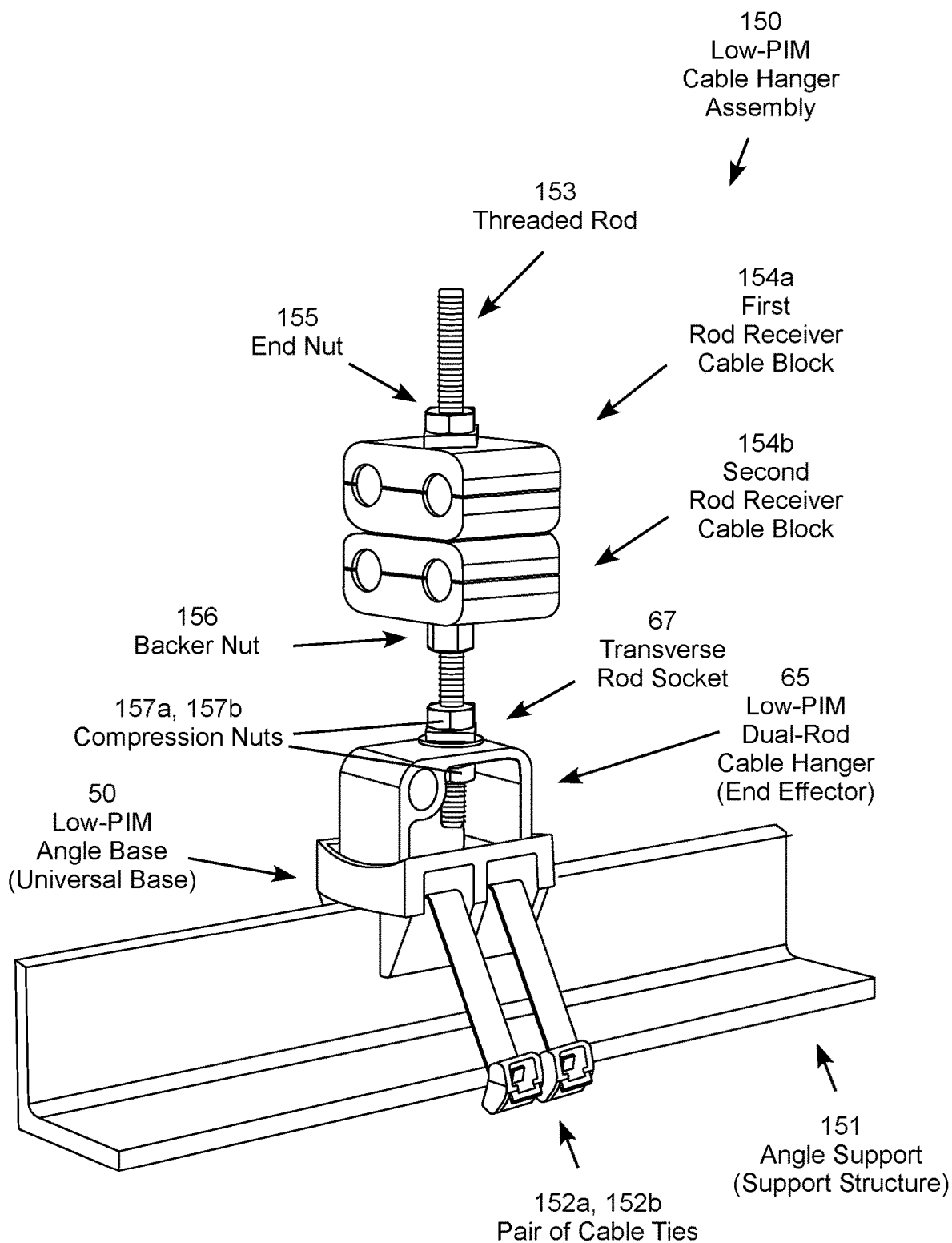
FIG. 15 is an exploded perspective view of another low-PIM cable hanger assembly including a universal angle base, a low-PIM dual-rod cable hanger, a threaded rod attached to a transverse rod socket of the low-PIM dual-rod cable hanger, and two low-PIM rod receiver cable blocks attached to the threaded rod.

FIG. 15 is an exploded perspective view of another low-PIM cable hanger assembly 150 including an angle base 50, a low-PIM dual-rod cable hanger 65, and a threaded rod 153 attached to the transverse rod socket 67 of the low-PIM dual-rod cable hanger. A pair of cable ties 152a, 152b secures the angle base 50 and the low-PIM dual-rod cable hanger 65 to the pole support 151. Two low-PIM rod receiver cable blocks 154a, 154b are attached to the threaded rod 153. In this embodiment, the low-PIM rod receiver cable blocks 154a, 154b are positioned next to each other and secured between an end nut 155 and a backer nut 156. The low-PIM dual-rod cable hanger 65 is secured between the angle base 50 and a compression nuts 157a, 157b allowing the low-PIM rod receiver cable blocks 154a, 154b and the low-PIM dual-rod cable hanger 65 to be spaced apart, as desired, along the threaded rod 153. Again, additional hardware, such as washers and lock washers, may also be included as a matter of design choice.

Figure 16:
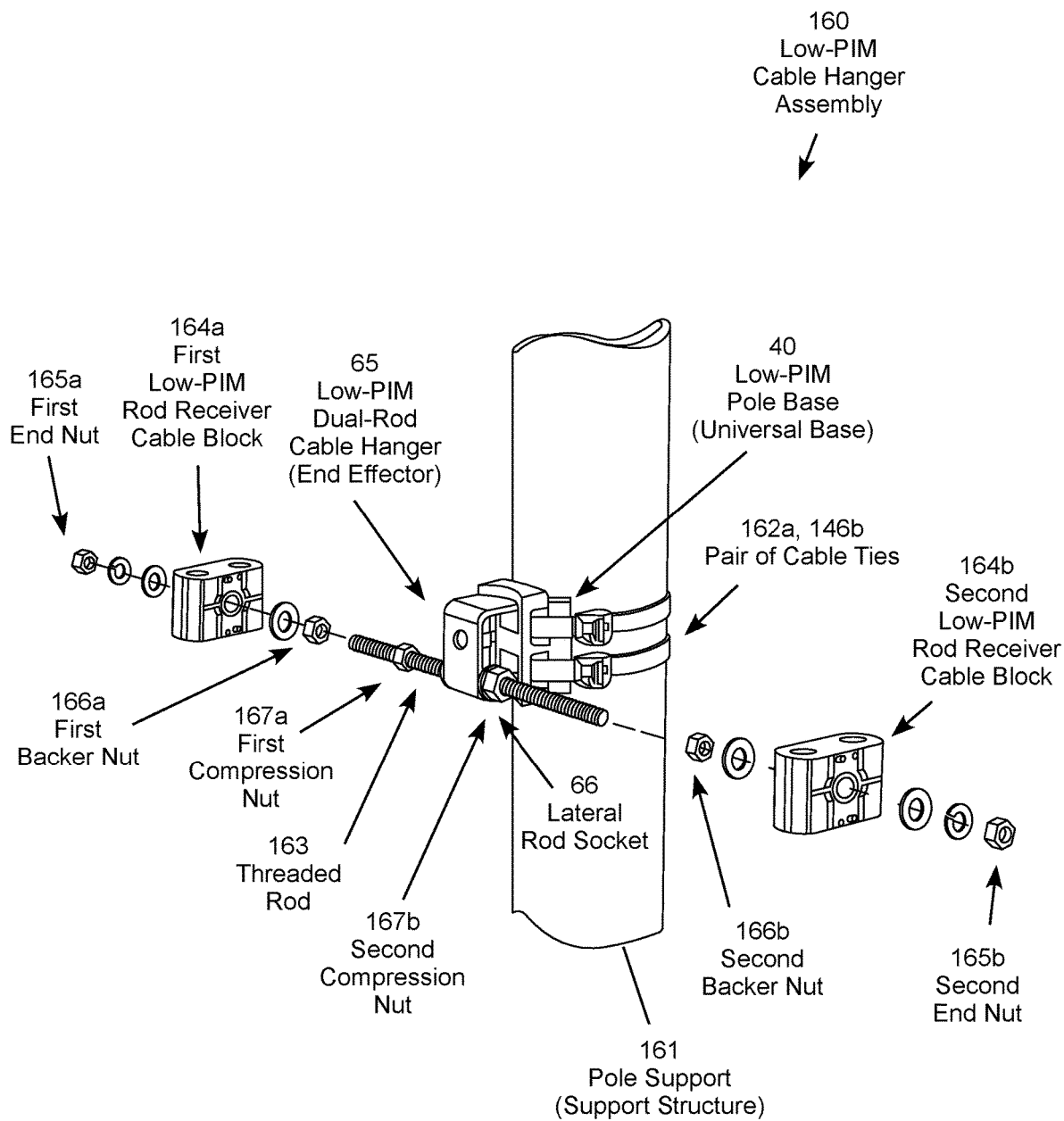
FIG. 16 is an exploded perspective view of another low-PIM cable hanger assembly including a universal pole base, a low-PIM dual-rod cable hanger, a threaded rod attached to a lateral rod socket of the low-PIM dual-rod cable hanger, and two low-PIM rod receiver cable blocks attached to the threaded rod.

FIG. 16 is an exploded perspective view of another low-PIM cable hanger assembly 160 including a pole base 40, a low-PIM dual-rod cable hanger 65, and a threaded rod 163 attached to a lateral rod socket 66 of the low-PIM dual-rod cable hanger. This embodiment is similar to the cable hanger assembly embodiment 140 shown in FIG. 14 except that it includes an pole base 40 instead of a angle base 50. A pair of cable ties 162a, 162b secures the angle base 50 and the low-PIM dual-rod cable hanger 65 to the pole support 161. The threaded rod 163 supports two low-PIM rod receiver cable blocks 164a, 164b positioned on opposing sides of the low-PIM dual-rod cable hanger 65. Hardware allows each low-PIM cable block to be secured at a desired position along the threaded rod 163. In this example, the first low-PIM cable block 164a is secured between a first end nut 165a and a first backer nut 166a, while the second low-PIM cable block 164b is secured between a second end nut 165b and a second backer nut 166b. The low-PIM dual-rod cable hanger 65 is secured between first and second compression nuts 167a and 167b allowing the low-PIM rod receiver cable blocks 164a, 146b and the low-PIM dual-rod cable hanger 65 to be spaced apart, as desired, along the threaded rod 163. Additional hardware, such as the washers and lock washers not specifically enumerated, may also be included as a matter of design choice.

Figure 17:
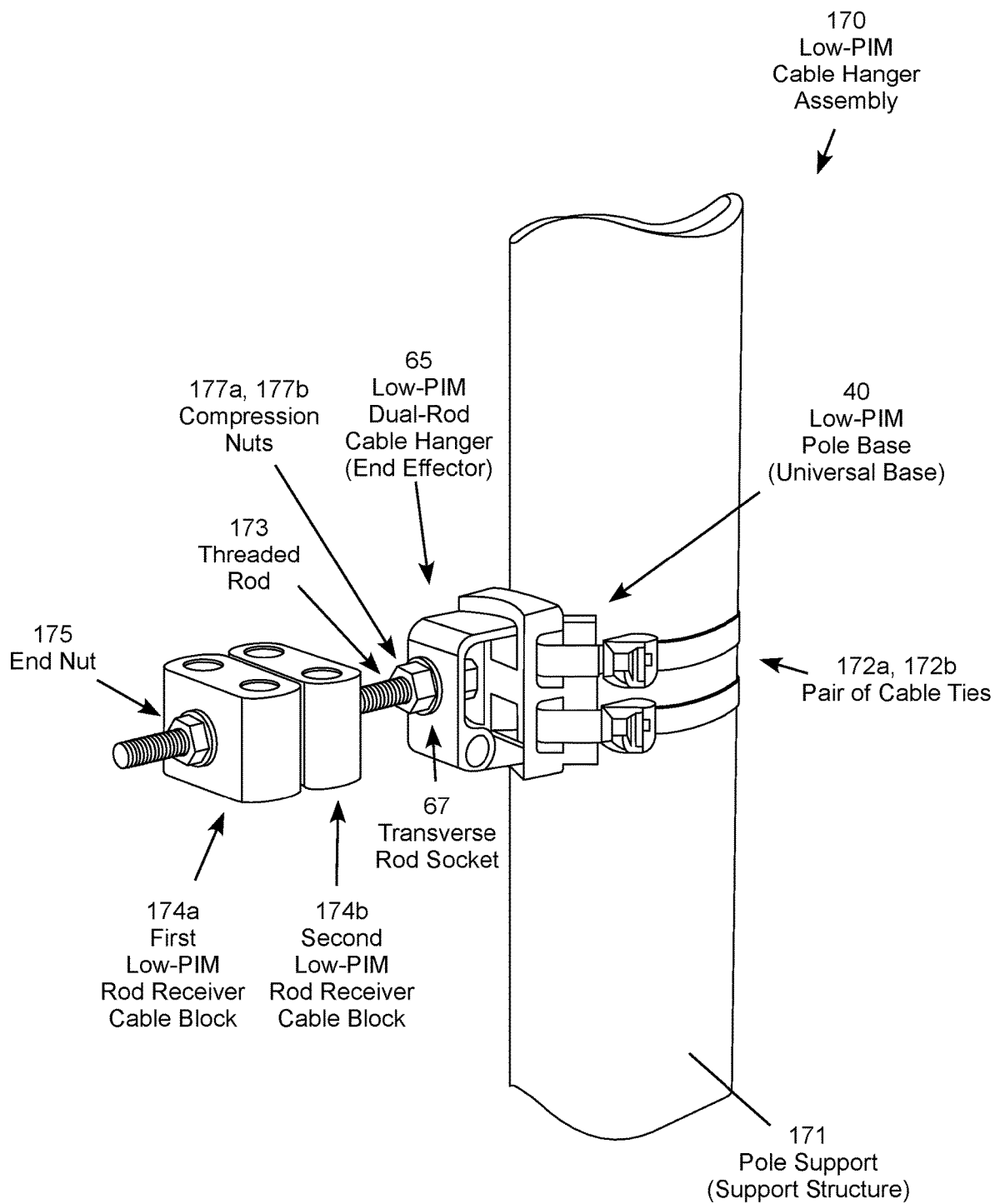
FIG. 17 is an exploded perspective view of another low-PIM cable hanger assembly including a universal pole base, a low-PIM dual-rod cable hanger, a threaded rod attached to a transverse rod socket of the low-PIM dual-rod cable hanger, and two low-PIM rod receiver cable blocks attached to the threaded rod.

FIG. 17 is an exploded perspective view of another low-PIM cable hanger assembly 170 including a pole base 40, a low-PIM dual-rod cable hanger 65, and a threaded rod 173 attached to the transverse rod socket 67 of the low-PIM dual-rod cable hanger. This embodiment is similar to the cable hanger assembly embodiment 150 shown in FIG. 15 except that it includes a pole base 40 instead of an angle base 50. A pair of cable ties 172a, 172b secures the pole base 40 and the low-PIM dual-rod cable hanger 65 to the pole support 171. Two low-PIM rod receiver cable blocks 174a, 174b are attached to the threaded rod 173. In this embodiment, the low-PIM rod receiver cable blocks 174a, 174b are positioned next to each other and secured between an end nut 175 and a backer nut (hidden behind the rod receiver cable block 174b). The low-PIM dual-rod cable hanger 65 is secured between the pole base 40 and a compression nuts 177a, 177b allowing the low-PIM rod receiver cable blocks 174a, 175b and the low-PIM dual-rod cable hanger 65 to be spaced apart, as desired, along the threaded rod 173. Again, additional hardware, such as washers and lock washers, may also be included as a matter of design choice.

Figure 18A:
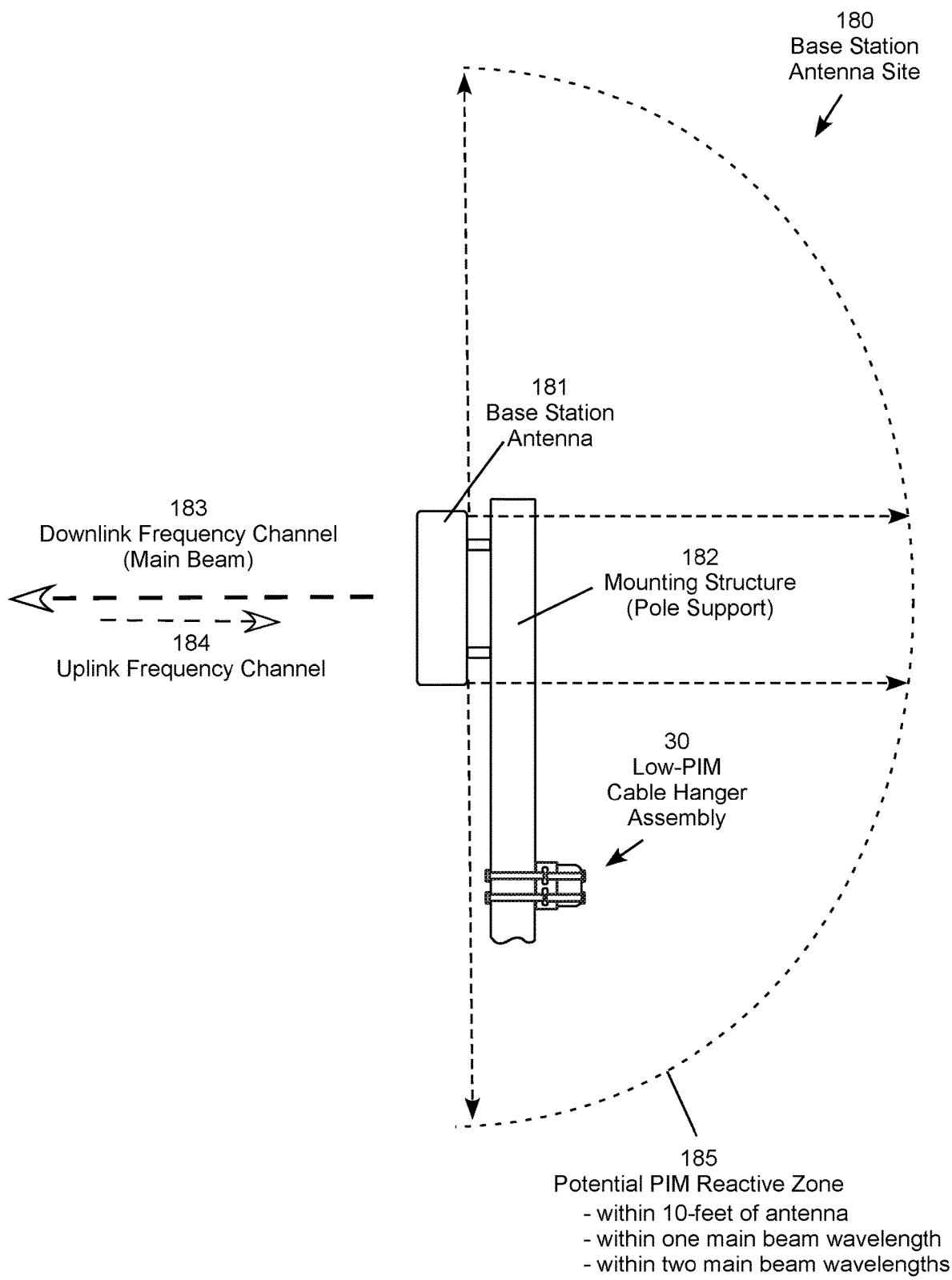
FIG. 18A is a conceptual side view of a low-PIM cable hanger assembly positioned within a potential PIM reactive zone of a base station antenna.
Figure 18B:
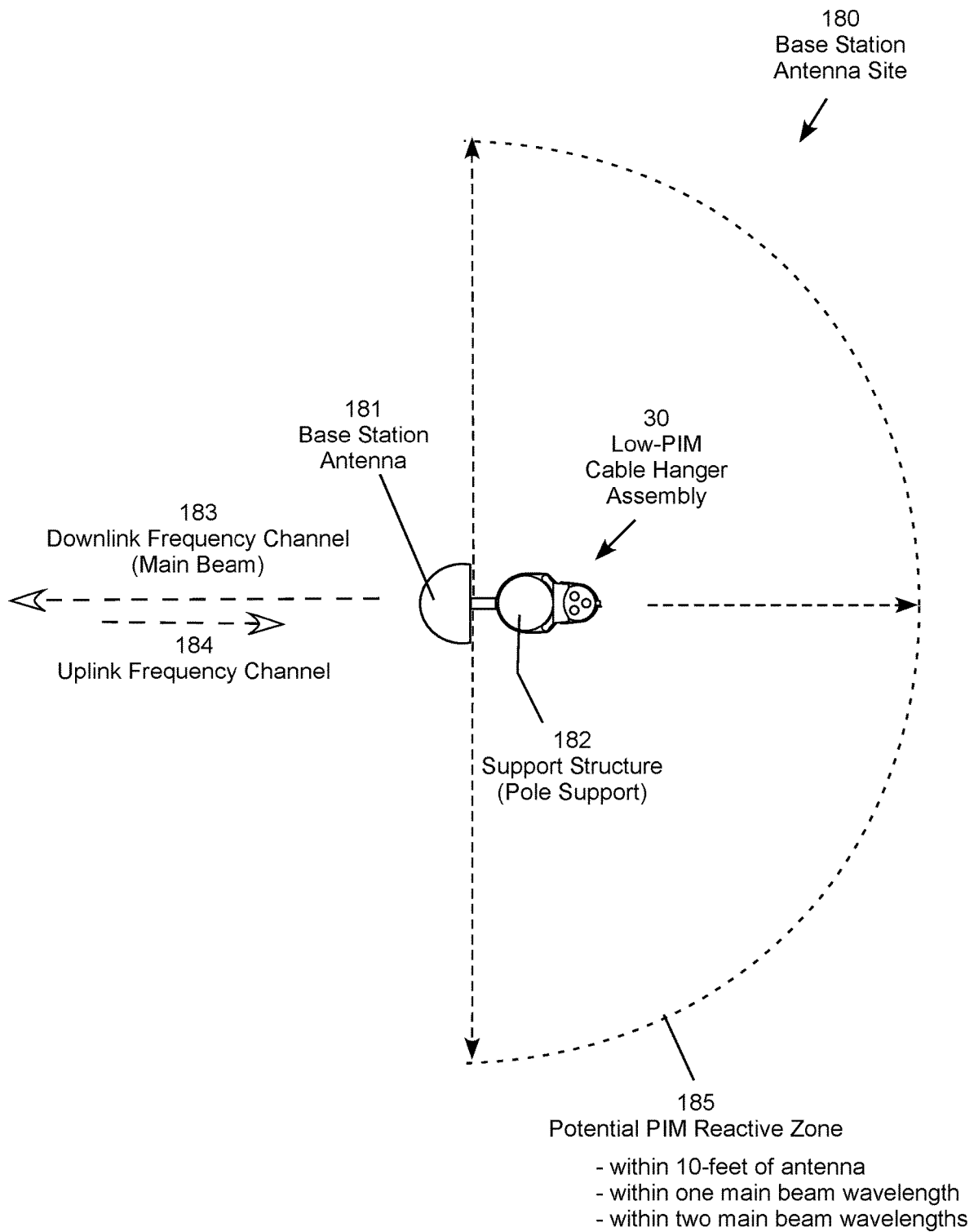
FIG. 18B is a conceptual top view of the low-PIM cable hanger assembly positioned within a potential PIM reactive zone of a base station antenna.

FIG. 18A is a conceptual side view and FIG. 18B is a conceptual top view of a representative base station antenna site 180 that includes a base station antenna 181 supported by a support structure 182. To briefly recap the problem to be solved, the antenna 181 directionally broadcasts higher-power downlink communication signals away from the antenna (generally referred to as the "main beam" of the antenna) within a downlink frequency channel 183 to registered mobile communication devices within the communication reach of the antenna. The antenna 181 also receives lower-power uplink communication signals from the registered mobile communication devices within a separate uplink frequency channel 184 allowing for duplex communications, such as mobile telephone conversations, between the antenna 181 and the registered mobile communication devices within the communication reach of the antenna. Passive intermodulation ("PIM") interference occurs when the downlink signals within the downlink frequency channel 183 mix at nonlinear junctions near the antenna 181 to create noise within the uplink frequency channel 184 received by the antenna. The PIM interference decreases the signal-to-interference plus-noise ratio ("SINR") of the uplink channel of the antenna 181, which reduces the communication quality and information carrying capacity (bandwidth) of the uplink frequency channel.

It is well documented that loosely touching metal-to-metal surfaces can behave in a non-linear fashion and become sources of PIM interference when illuminated by high power RF signals. For this reason, the coaxial cables and other components associated with operation of the antenna are located well outside and behind the main beam of the antenna. It has recently been determined, however, that loose metal-to-metal connections located behind a base station antenna can generate high levels of passive intermodulation. Even though this region is well outside the main beam of the antenna, enough RF energy can be present in this region to excite non-linear objects and generate PIM interference. Metal brackets and associated hardware for supporting RF, optical, ground and remote electrical tilt ("RET") cables are common sources of loose metal-to-metal contact found in this region behind and close to the base station antenna. Embodiments include a system of low-PIM cable hanger assemblies designed to mitigate PIM interference by the equipment used to support the cables and other components associated with the operation of the antenna, which are typically located near the antenna outside the main beam of the antenna.

To develop standards for mitigating PIM, technicians may define a potential PIM reactive zone 185 in which PIM mitigation equipment should be installed. FIGS. 18A-18B illustrate this practice for a representative example base station antenna site 180, in which a representative low-PIM cable hanger assembly 30 is attached to the support structure 182 within a potential PIM reactive zone 185 defined for an antenna 181. In this example, the representative low-PIM cable hanger assembly 30 is located well outside the main beam 183 and physically behind the antenna 181 on the opposite side of the support structure 182 from the antenna. The low-PIM cable hanger assembly 30 is nevertheless specified to provide PIM mitigation because it is still located with the potential PIM reactive zone 185 defined for the antenna 181. The low-PIM cable hanger assembly 30 is representative of the cable hanger assemblies generally, as all of the cable hanger assemblies described in the disclosure, and variations of these specific examples, are intended for deployment as PIM mitigation measures in the potential PIM reactive zones of cellular base station antennas.

While the low-PIM cable hanger assembly embodiments of the present invention can be utilized in any desired location, they are particularly effective for mitigating PIM interference when deployed in the potential PIM reactive zone 185 near the base station antenna 181. Although PIM generation is a function of the antenna broadcast frequency and power, technicians may use a standard distance, such as 10-feet from the antenna 181, to establish the potential PIM reactive zone 185 where PIM mitigation is appropriate. As other options, the potential PIM reactive zone 185 may be established to be a function of the antenna broadcast frequency, such as one or two wavelengths of the main beam frequency channel 183 of the antenna 181. Other factors, such as the broadcast power of the antenna 181, the presence of reflective surfaces in the physical environment of the antenna, the width of the uplink channel, the use of electronic filtering, and other relevant factors may also be taken into account when establishing the potential PIM reactive zone for a particular antenna. For administrative simplicity, however, the standard set for potential PIM reactive zone 185 may ultimately be defined to be a set distance, such as 10-feet from the antenna.

While particular aspects of the present subject matter have been shown and described in detail, it will be apparent to those skilled in the art that, based upon the teachings of this disclosure, changes and modifications may be made without departing from the subject matter described in this disclosure and its broader aspects and, therefore, the appended claims are to encompass within their scope all such changes and modifications as are within the true spirit and scope of the subject matter described in this disclosure. Although particular embodiments of this disclosure have been illustrated, it is apparent that various modifications and embodiments of the disclosure may be made by those skilled in the art without departing from the scope and spirit of the disclosure.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. The disclosure is defined by the following claims, which should be construed to encompass one or more structures or function of one or more of the illustrative embodiments described above, equivalents and obvious variations. It will therefore be appreciated that the present invention provides significant improvements. The foregoing relates only to the exemplary embodiments of the present invention, and that numerous changes may be made therein without departing from the spirit and scope of the invention as defined by the following claims.

The invention claimed is:

1. A low-PIM cable hanger assembly, comprising:
   a low-PIM universal base comprising an end effector receptacle and a mounting adapter shaped to mount to a support structure;
   an end effector comprising a fitting shaped to fit within the end effector receptacle of the universal base;
   at least one cable tie looped around a portion of the support structure, a portion of the universal base, and a portion of the end effector attaching the end effector to the universal base and also attaching the end effector and the universal base to the support structure.

2. The low-PIM cable hanger assembly of claim 1, further comprising a pair of cable tie slots in the universal base and a pair of cable ties, each extending through a respective cable slot, attaching the end effector to the universal base and also attaching the end effector and the universal base to the support structure.

3. The low-PIM cable hanger assembly of claim 1, wherein the mounting adapter comprises a pole adapter and the support structure comprises a pole support.

4. The low-PIM cable hanger assembly of claim 1, wherein the mounting adapter comprises an angle adapter and the support structure comprises a angle support.

5. The low-PIM cable hanger assembly of claim 1, wherein:
the end effector comprises a fitting comprising a first cable tie slot;
the end effector receptacle of the universal base comprises a second cable tie slot;
the fitting is positioned within the end effector receptacle with the first cable tie slot aligned with the second cable tie slot; and
the cable tie slot is looped around a portion of the support structure and through the first and second cable tie slots.

6. The low-PIM cable hanger assembly of claim 1, wherein the end effector comprises a stackable cable hanger.

7. The low-PIM cable hanger assembly of claim 1, wherein the end effector comprises a junction box.

8. The low-PIM cable hanger assembly of claim 1, comprising a first universal base and first end effector, further comprising a second universal base and a second end effector, further comprising at least one common cable tie attaching the first and second universal bases and the first and second end effectors to the support structure.

9. The low-PIM cable hanger assembly of claim 1, wherein the end effector comprises a dual-rod cable hanger.

10. The low-PIM cable hanger assembly of claim 9, wherein the dual-rod cable hanger further comprises a lateral rod socket and a transverse rod socket, further comprising:
a threaded rod extending through the lateral rod socket;
a first low-PIM rod receiver cable block secured to the threaded rod spaced apart from the dual-rod cable hanger on a first side of the dual-rod cable hanger;
a second low-PIM rod receiver cable block secured to the threaded rod spaced apart from the dual-rod cable hanger on a second side of the dual-rod cable hanger.

11. The low-PIM cable hanger assembly of claim 9, wherein the dual-rod cable hanger further comprises a lateral rod socket and a transverse rod socket, further comprising:
a threaded rod extending through the transverse rod socket;
one or more low-PIM rod receiver cable blocks secured to the threaded rod spaced apart from the dual-rod cable hanger.

12. The low-PIM cable hanger assembly of claim 1, wherein the support structure comprises metal at an interface location between the universal base and the support structure within a potential PIM reactive zone of a cellular base station antenna.

13. A low-PIM cable hanger system, comprising:
a plurality of different types of low-PIM universal bases, each type of low-PIM universal base comprising a standard end effector receptacle and a type of mounting adapter shaped to mount to a different type of support structure;
a plurality of different types of end effectors, each type of end effector comprising a standard fitting shaped to interchangeably fit within the standard end effector receptacle and a type of cable hanger or cable hanger junction box;
a plurality of cable ties, each looped around a portion of a selected support structure, a portion of a selected universal base and a portion of a selected end effector attaching the selected end effector to the selected universal base and also attaching the selected end effector and the selected universal base to the selected support structure.

14. The low-PIM cable hanger system of claim 13, wherein the different types of low-PIM universal bases comprise a low-PIM pole base and a low-PIM angle base.

15. The low-PIM cable hanger system of claim 13, wherein the different types of end effectors comprise a stackable cable hanger, a junction box, and a dual-rod cable hanger.

16. The low-PIM cable hanger system of claim 13, wherein each low-PIM universal base is configured for attachment to a metal support structure to prevent metal-to-metal contact between the universal base and the metal support structure to mitigate PIM interference when the universal base and the metal support structure are positioned within a potential PIM reactive zone of a cellular base station antenna.

17. A method for mitigating PIM at a cellular base station antenna site, comprising:
obtaining a low-PIM universal base comprising an end effector receptacle comprising a mounting adapter shaped to mount to a support structure;
obtaining an end effector comprising a fitting shaped to fit within the end effector receptacle of the universal base;
positioning the universal base against the end effector with the fitting of the end effector engaged with the end effector receptacle of the universal base;
looping a low-PIM cable tie around a portion of the support structure, a portion of the universal base, and a portion of the end effector to attach the end effector to the universal base and to also attach the end effector and the universal base to an interface location on a support structure comprising metal within a potential PIM reactive zone of the cellular base station antenna;
attaching a cable from the cellular base station antenna directly or indirectly to the end effector; and
operating the cellular base station antenna.

18. The method of claim 17, wherein the universal base comprises a mounting adapter selected from the group consisting of a pole adapter and an angle adapter, and the interface location on the support structure is selected from the group consisting of a pole support and an angle support.

19. The method of claim 17, wherein the end effector is selected from the group consisting of a stackable cable hanger, a junction box, and a dual-rod cable hanger.

20. The method of claim 17, wherein the a universal base is a first universal base, the end effector is a first end effector, and the cable is a first cable, further comprising"
positioning the second universal base against the second end effector with a fitting of the second end effector engaged with an end effector receptacle of the second universal base;
looping the low-PIM cable tie around a portion of the second universal base and a portion of the second end effector to attach the second end effector to the second universal base and to also attach the second end effector and the second universal base to the interface location on the support structure;

attaching a second cable from the cellular base station antenna directly or indirectly to the second end effector.

22. The method of claim 17, wherein the end effector comprises a fitting comprising a first cable tie slot and the end effector receptacle of the universal base comprises a second cable tie slot, further comprising:

positioning the fitting within the end effector receptacle with the first cable tie slot aligned with the second cable tie slot; and looping the cable tie around a portion of the support structure and through the first and second cable tie slots.

22. A low-PIM cable hanger assembly, comprising:

a low-PIM universal base comprising an end effector receptacle and a mounting adapter shaped to mount to a support structure;

an end effector configured to support a plurality of cables and comprising a fitting shaped to fit within the end effector receptacle of the universal base;

a first cable tie looped around a portion of the support structure and a portion of the universal base attaching the universal base to the support structure; and a second cable tie looped around a portion of the end effector and a portion of the universal base attaching the end effector to the universal base.

* * * * *